(12) United States Patent
Miyata et al.

(10) Patent No.: US 12,155,915 B2
(45) Date of Patent: Nov. 26, 2024

(54) IMAGE SENSOR AND IMAGING DEVICE

(71) Applicant: NIPPON TELEGRAPH AND TELEPHONE CORPORATION, Tokyo (JP)

(72) Inventors: Masashi Miyata, Musashino (JP); Naru Nemoto, Musashino (JP); Mitsumasa Nakajima, Musashino (JP); Toshikazu Hashimoto, Musashino (JP)

(73) Assignee: NIPPON TELEGRAPH AND TELEPHONE CORPORATION TOKYO, Tokyo (JP)

( * ) Notice: Subject to any disclaimer, the term of this patent is extended or adjusted under 35 U.S.C. 154(b) by 76 days.

(21) Appl. No.: 17/918,909

(22) PCT Filed: May 21, 2020

(86) PCT No.: PCT/JP2020/020177
§ 371 (c)(1),
(2) Date: Oct. 14, 2022

(87) PCT Pub. No.: WO2021/234924
PCT Pub. Date: Nov. 25, 2021

(65) Prior Publication Data
US 2023/0239552 A1 Jul. 27, 2023

(51) Int. Cl.
*H04N 23/12* (2023.01)
*G02B 27/28* (2006.01)
*H04N 25/70* (2023.01)

(52) U.S. Cl.
CPC ........... *H04N 23/12* (2023.01); *G02B 27/283* (2013.01); *H04N 25/70* (2023.01)

(58) Field of Classification Search
CPC ...... H04N 23/12; H04N 25/70; G02B 27/283; H01L 27/14605; H01L 27/14627; H01L 27/14629; H01L 27/14645
See application file for complete search history.

(56) References Cited

U.S. PATENT DOCUMENTS

| 10,720,993 B2* | 7/2020 | Lezec | H04B 10/25137 |
| 2008/0170143 A1* | 7/2008 | Yoshida | H01L 27/14645 |
| | | | 348/294 |

(Continued)

FOREIGN PATENT DOCUMENTS

WO 2019/202890 A1 10/2019

OTHER PUBLICATIONS

Kamali et al., "A review of dielectric optical metasurfaces for wavefront control", arXiv:1804.09802 [physics.optics], Apr. 25, 2018 (Year: 2018).*

(Continued)

*Primary Examiner* — Timothy J Henn
(74) *Attorney, Agent, or Firm* — XSENSUS LLP

(57) ABSTRACT

An imaging element (100) includes a pixel array (110) in which pixels (130) are placed in a two-dimensional array, the pixel including a photoelectric conversion element; and a polarization-wavelength separation lens array (120) opposed to the pixel array (110), the polarization-wavelength separation lens array (120) including polarization-wavelength separation lens (160) placed in a two-dimensional array, the polarization-wavelength separation lens (160) including a plurality of microstructures for condensing incident light at different positions on the pixel array (110) according to the polarization direction and wavelength components of the incident light.

8 Claims, 39 Drawing Sheets

(56) References Cited

U.S. PATENT DOCUMENTS

| | | | |
|---|---|---|---|
| 2008/0231960 A1* | 9/2008 | Van Gorkom | G02B 5/045 |
| | | | 359/629 |
| 2015/0377780 A1* | 12/2015 | Walters | G01N 21/4788 |
| | | | 436/164 |
| 2020/0124866 A1* | 4/2020 | Camayd-Munoz | G02B 1/002 |
| 2020/0266230 A1 | 8/2020 | Miyata et al. | |
| 2021/0366961 A1* | 11/2021 | Yanagita | H01L 27/14621 |
| 2022/0341782 A1* | 10/2022 | Zhang | G01J 3/2823 |
| 2023/0096263 A1* | 3/2023 | Miyata | G02B 3/0056 |
| | | | 250/208.1 |

OTHER PUBLICATIONS

Gruev et al., "CCD polarization imaging sensor with aluminum nanowire optical filters", Optics Express, vol. 18, No. 18, 2010, pp. 19087-19094.
Arbabi et al., "Full-Stokes Imaging Polarimetry Using Dielectric Metasurfaces", ACS Photonics, vol. 5, 2018, pp. 3132-3140.
Miyata et al., "High-Sensitivity Color Imaging Using Pixel-Scale Color Splitters Based on Dielectric Metasurfaces", ACS Photonics, vol. 6, No. 6, 2019, pp. 1442-1450.
Khorasaninejad et al., "Multispectral Chiral Imaging with a Metalens", Nano Letters, vol. 16, 2016, pp. 4595-4600.

\* cited by examiner

IMAGE SENSOR AND IMAGING DEVICE

CROSS-REFERENCE TO RELATED APPLICATION

The present application is based on PCT filing PCT/JP2020/020177, filed May 21, 2020, the entire contents of which are incorporated herein by reference.

TECHNICAL FIELD

The present invention relates to an imaging element and an imaging apparatus.

BACKGROUND ART

A typical imaging apparatus acquires a two-dimensional image including intensity information and color information about light from a subject by using a lens optical system and two-dimensional imaging elements such as a CCD (Charge Coupled Device) sensor and a CMOS (Complementary Metal Oxide Semiconductor) sensor.

In this case, in order to acquire color information about a subject on imaging elements, color separation is necessary for incident light on each pixel including a photoelectric conversion element. In a typical color imaging element, a subtractive-process color filter made of an organic material or an inorganic material is opposed to each pixel. A typical color imaging element passes only light of a desired waveband and absorbs or reflects light of an undesired waveband using color filter, thereby acquiring the signals of red (R), green (G), and blue (B) for each pixel and generating a two-dimensional image including color information.

Polarization-color imaging elements that enable the acquisition of two-dimensional images including polarization information in addition to the color image have been earnestly studied and developed in recent years. This is because polarization information about light includes useful information that cannot be acquired only by the intensity or color of light. The polarization information is, for example, information about the shape of an object surface or the state of a material.

A polarization-color imaging element acquires light intensity for the linear-polarization direction components of 0°, 45°, 90°, and −45° with respect to any one axis on an imaging plane. Thus, the polarization-color imaging element can obtain three of Stokes parameters for describing a polarization state, thereby obtaining information about a polarization direction and a degree of polarization in addition to color information. An image processing apparatus generates an image including color information and information about a polarization direction and a degree of polarization, enabling the application such as the estimation of the shape of an object surface, the acquisition of the stress condition of a material, and the object recognition or the like. In order to acquire multidimensional optical information in an onboard camera, an IoT (Internet of Things) device, and a medical device or the like, the implementation of a polarization-color imaging element that can be easily manufactured with high sensitivity has been particularly expected in recent years.

As a method for implementing a polarization-color imaging element, a method of using a micromachining technique is proposed (for example, see NPL 1). In the method described in NPL 1, a plurality of metallic-wire grid polarization filters having different polarizing transmission axes are integrated on each pixel of a sensor, so that four different polarization directions are acquired for each pixel.

FIG. 26 is an explanatory drawing schematically illustrating the configuration of a conventional polarization-color imaging element. FIG. 27 illustrates a part of a cross-sectional view of the conventional polarization-color imaging element. As illustrated in FIGS. 26 and 27, the conventional polarization-color imaging element includes a neutral-density (absorption) polarization filter 440 and a conventional color filter 450 that are integrated in a cascade arrangement, thereby acquiring a two-dimensional image (polarization color image) including color information and polarization information about a subject. The conventional polarization-color imaging element illustrated in FIG. 27 includes a polarization filter 440 and a color filter 450 in a transparent layer 430 that is provided between microlenses 420 and a pixel array 410 including a wire layer 412 and pixels 411 including photoelectric conversion elements placed in a two-dimensional array.

Furthermore, a method of integrating a wave plate having a microstructure and a polarization filter on a sensor and a method of integrating a polarization filter array of photonic crystals on a sensor are proposed as similar techniques.

In the conventional polarization-color imaging element, however, light incident on the sensor passes through the filter array of two layers and then reaches the pixels, so that the total amount of received light is only $\frac{1}{2} \times \frac{1}{3} = \frac{1}{6}$ of the amount of incident light. This is because the polarization filter only transmits light in a polarization direction parallel to the transmission axis and thus passes at most a half of the amount of incident light, whereas the color filter only transmits light of a waveband corresponding to any one of R, G, and B and thus passes only one third of the amount of incident light. The missing portion of light is a loss caused by absorption or reflection through each filter and is not usable for the construction of an image.

Thus, the light utilization efficiency of the conventional polarization-color imaging element is at most 17%, and the sensitivity thereof is considerably limited. Moreover, typically in an onboard camera and an IoT device to which a polarization-color imaging element is desirably applied, the amount of light usable for imaging is limited, and the amount of light received by a pixel has been inevitably reduced due to finer sensor pixels (higher image resolutions) in recent years. Hence, in order to mount the polarization-color imaging element in an onboard camera or an IoT device, it is necessary to suppress the sensitivity degradation of the polarization-color imaging element. Furthermore, the conventional polarization-color imaging element requires stacking of the filter array of two layers that are formed using completely different materials and manufacturing methods, resulting in a larger number of manufacturing steps and higher manufacturing cost as compared with a typical color imaging element.

Thus, polarization imaging elements have been recently proposed instead of polarization filters. The polarization imaging element uses a polarizing element having a microstructure that can split incident light according to a polarization direction (for example, see NPL 2). The polarization imaging element described in NPL 2 includes the polarizing element having a microstructure that can split incident light for each polarization component. This theoretically eliminates an optical loss in the extraction of polarization information, thereby improving light utilization efficiency.

FIG. 28 illustrates a part of a cross-sectional view of the conventional polarization imaging element. As illustrated in FIG. 28, a microstructure pattern 560 in alignment with the pixels of the pixel array 410 is disposed at the bottom of a transparent substrate 570, so that incident light splits laterally in the polarization direction and condenses at different pixels 411 disposed immediately under the microstructure pattern 560. In the polarization imaging element illustrated in FIG. 28, the microstructure pattern 560 acts as a polarization splitting lens having a different condensing position according to the polarization direction because of the effective birefringent effect and spatial layout of each structure. Hence, in the polarization imaging element illustrated in FIG. 28, microstructure patterns for splitting the linear polarization-direction components of 0° and 90° and microstructure patterns for splitting the linear polarization-direction components of 45° and 135° are alternately disposed in lines on a two-dimensional pixel array, so that four adjacent pixels can receive light having different polarization components.

Furthermore, color imaging elements are also proposed instead of color filters. The color imaging element uses a spectral element having a microstructure that can split incident light according to wavelength regions (for example, see NPL 3). NPL 3 describes a method of theoretically eliminating an optical loss in the extraction of color information and improving light utilization efficiency by using the microstructure that can split incident light for each wavelength region.

FIG. 29 illustrates a part of a cross-sectional view of the conventional color imaging element. As illustrated in FIG. 29, in the color imaging element illustrated in NPL 3, a microstructure pattern 660 in alignment with pixels splits incident light in three directions according to wavelength regions (three colors of RGB) and condenses the light at the different pixels 411 disposed immediately under the microstructure pattern 660. The microstructure pattern 660 is provided to act as a color splitter having a different deflection direction according to the wavelength region because of an effective optical phase-delay effect, which depends on the wavelength of each microstructure, and the spatial layout of each structure.

Hence, in the color imaging element illustrated in FIG. 29, a color splitter including the microstructure pattern 660 is disposed on the two-dimensional pixel array, so that three pixels adjacent to one another in the uniaxial direction can receive light having different wavelength components. In this case, an image processing apparatus reproduces color information by performing signal processing on a photoelectric conversion signal, which is outputted from each photoelectric conversion element, by using a matrix operation and an inverse problem solution, thereby generating a color image.

CITATION LIST

Non Patent Literature

[NPL 1] V. Gruev, R. Perkins, and T. York, "CCD polarization imaging sensor with aluminum nanowire optical filters", Opt. Express 18, 19087-19094 (2010).
[NPL 2] E. Arbabi, S. M. Kamali, A. Arbabi, and A. Faraon, "Full-Stokes Imaging Polarimetry Using Dielectric Metasurfaces", ACS Photonics 5, 3132-3140 (2018).
[NPL 3] M. Miyata, M. Nakajima, and T. Hashimoto, "High-Sensitivity Color Imaging Using Pixel-Scale Color Splitters Based on Dielectric Metasurfaces", ACS Photonics 6, 1442-1450 (2019).
[NPL 4] M. Khorasaninejad, W. T. Chen, A. Y. Zhu, J. Oh, R. C. Devlin, D. Rousso, and F. Capasso, "Multispectral Chiral Imaging with a Metalens", Nano Lett. 16, 4595-4600 (2016).

SUMMARY OF THE INVENTION

Technical Problem

However, as described above, the implementation of a polarization color imaging element according to the methods described in NPL 2 and NPL 3 requires the use of a color filter or a polarization filter together. Hence, in the methods described in NPL 2 and NPL 3, an optical loss is caused by at least the color filter or the polarization filter, thereby restricting the effect of increasing the total amount of received light. Furthermore, in the methods described in NPL 2 and NPL 3, it is necessary to stack at least one filter layer and one polarization split layer and/or color separation layer on pixels, which results in, as in the use of a filter array of two layers, a larger number of manufacturing steps and higher manufacturing cost as compared with a typical color imaging element.

Alternatively, the polarization splitting lens and the color splitter in NPL 2 and NPL 3 may be stacked in a cascade arrangement so as to configure a polarization-color imaging element with the maximized effect of increasing the total amount of received light. However, this configuration requires two layers: the polarization split layer and the color separation layer as in the foregoing configuration, resulting in a larger number of manufacturing steps and higher manufacturing cost as compared with a typical color imaging element. Since both of the elements deflect light to separate optical components, an optimization design and a pixel layout are further required, the optimization design being made for a subsequent element in strict consideration of the influence (including an incident angle of light and an angle of outgoing radiation) of the light deflection of a preceding element. At present, this configuration is substantially impractical.

The present invention has been devised in view of the problem. An object of the present invention is to provide an imaging element and an imaging apparatus that can accurately generate a color image and a polarization image with a simple configuration.

Means for Solving the Problem

In order to solve the problem and attain the object, an imaging element according to the present invention is characterized by including: a pixel array in which pixels are placed in a two-dimensional array, the pixel including a photoelectric conversion element; and a spectral element array opposed to the pixel array, the spectral element array including spectral elements placed in a two-dimensional array, the spectral element including a plurality of microstructures for condensing incident light at different positions on the pixel array according to the polarization direction and wavelength components of the incident light.

An imaging apparatus according to the present invention is characterized by including: the imaging element; an imaging optical system for forming an optical image on the imaging surface of the imaging element; and a signal processing unit for processing an electric signal outputted from the imaging element and generating a polarization image and a color image.

Effects of the Invention

The present invention can provide an imaging element and an imaging apparatus that can accurately generate a color image and a polarization image with a simple configuration.

BRIEF DESCRIPTION OF DRAWINGS

FIG. 2-1 schematically illustrates a part of a pixel array and a polarization-wavelength separation lens array of an imaging element in cross section according to the embodiment.

FIG. 2-2 schematically illustrates a part of the pixel array and the polarization-wavelength separation lens array of the imaging element in cross section according to the embodiment.

FIG. 2-3 schematically illustrates a part of the pixel array and the polarization-wavelength separation lens array of the imaging element in cross section according to the embodiment.

FIG. 3-1 schematically illustrates another example of a part of the pixel array and the polarization-wavelength separation lens array of the imaging element in cross section according to the embodiment.

FIG. 3-2 schematically illustrates another example of a part of the pixel array and the polarization-wavelength separation lens array of the imaging element in cross section according to the embodiment.

FIG. 3-3 schematically illustrates another example of a part of the pixel array and the polarization-wavelength separation lens array of the imaging element in cross section according to the embodiment.

FIG. 5-1 is a cross-sectional view taken along line A-A' of FIG. 4.

FIG. 5-2 is a cross-sectional view taken along line A-A' of FIG. 4.

FIG. 5-3 is a cross-sectional view taken along line A-A' of FIG. 4.

FIG. 6-1 is a cross-sectional view taken along line B-B' of FIG. 4.

FIG. 6-2 is a cross-sectional view taken along line B-B' of FIG. 4.

FIG. 6-3 is a cross-sectional view taken along line B-B' of FIG. 4.

FIG. 10-1 indicates an example of a side view illustrating the columnar structure of the polarization-wavelength separation lens according to Embodiment 1.

FIG. 10-2 is a view taken along an arrow C of FIG. 10-1.

FIG. 16-1 is a plan view of the imaging element serving as a calculation model.

FIG. 16-2 is a cross-sectional view taken along line D-D' of FIG. 16-1.

DESCRIPTION OF EMBODIMENTS

Figure 1:
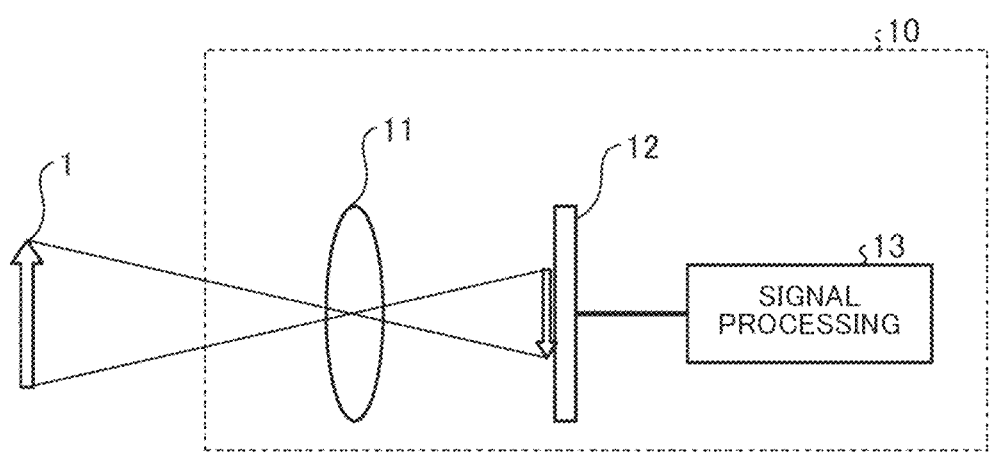
FIG. 1 is a side view illustrating the schematic configuration of an imaging apparatus according to an embodiment.

The most appropriate embodiment according to the present invention will be described below with reference to the drawings. Note that, in the following description, shape, size, and positional relationship are roughly illustrated for facilitating the understanding, therefore the present invention is not limited to the illustrated shape, size, and positional relationship in the drawings. Accordingly, in the illustrated drawings, the parts indicating the same operations have the same signs.

Embodiment

[Imaging Apparatus]

First, an imaging apparatus according to an embodiment of the present invention will be described below. FIG. 1 is a side view illustrating the schematic configuration of an imaging apparatus according to an embodiment.

As illustrated in FIG. 1, an imaging apparatus 10 according to the embodiment includes a lens optical system 11, an imaging element 12, and a signal processing unit 13. The lens optical system 11 includes a photoelectric conversion element, for example, a CCD or a CMOS. The signal processing unit 13 processes a photoelectric conversion signal outputted from the imaging element 12 and generates an image signal.

An object 1 is irradiated with light such as natural light and illumination light, and light transmitted/reflected/scattered from the object 1 or light emitted from the object 1 forms an optical image on the imaging element 12 through the lens optical system 11. Typically, in order to correct various optical aberrations, the lens optical system 11 includes a lens set composed of a plurality of lenses placed along the optical axis. FIG. 1 is simplified to illustrate the lens optical system 11 as a single lens. The signal processing unit 13 has an image signal output for transmitting the generated image signal to the outside.

The imaging apparatus 10 may be provided with known constituent elements such as an optical filter for cutting infrared light, an electronic shutter, a view finder, a power source (battery), and a flashlight. The description thereof is omitted because the description is not particularly necessary for understanding of the present invention. The foregoing configuration is merely exemplary. Known elements may be properly used in combination as constituent elements other than the lens optical system 11, the imaging element 12, and the signal processing unit 13.

[Imaging Element]

Figures 1, 2:
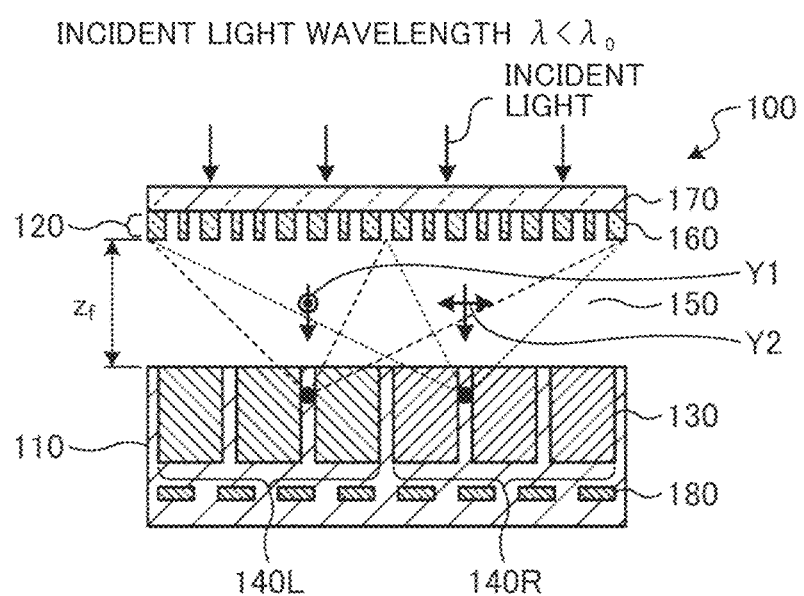
Figure 2:
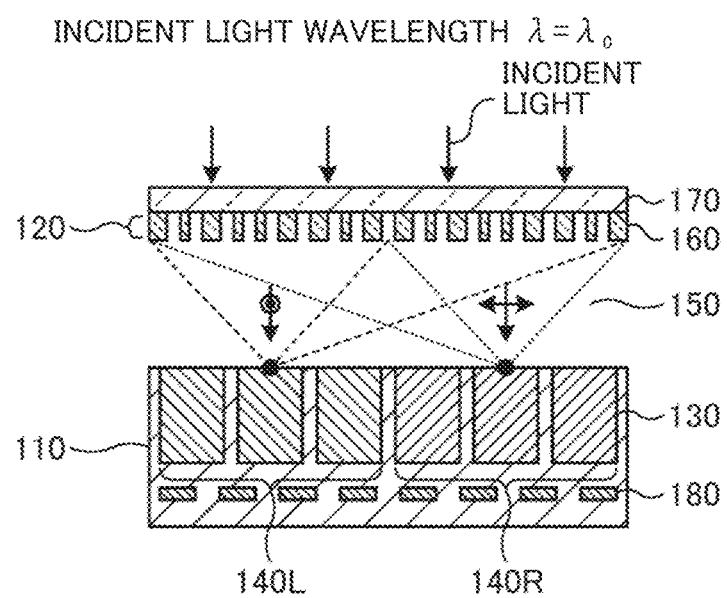
Figures 2, 3:
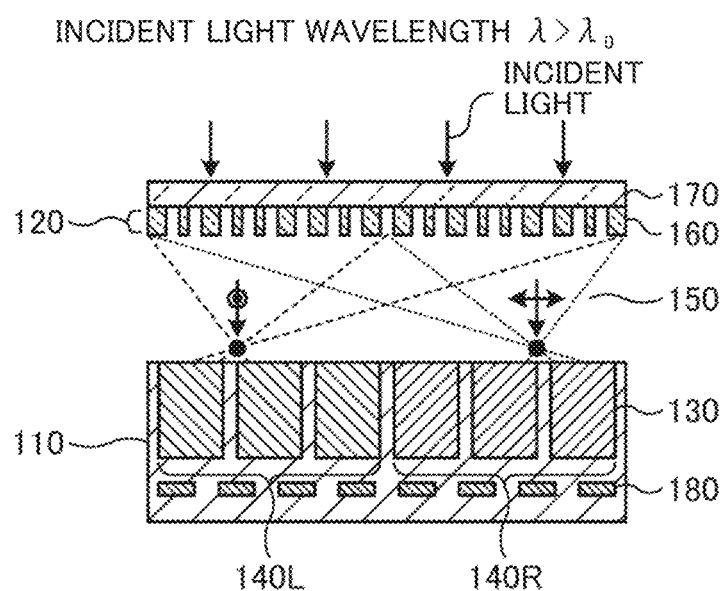
Figures 1, 3:
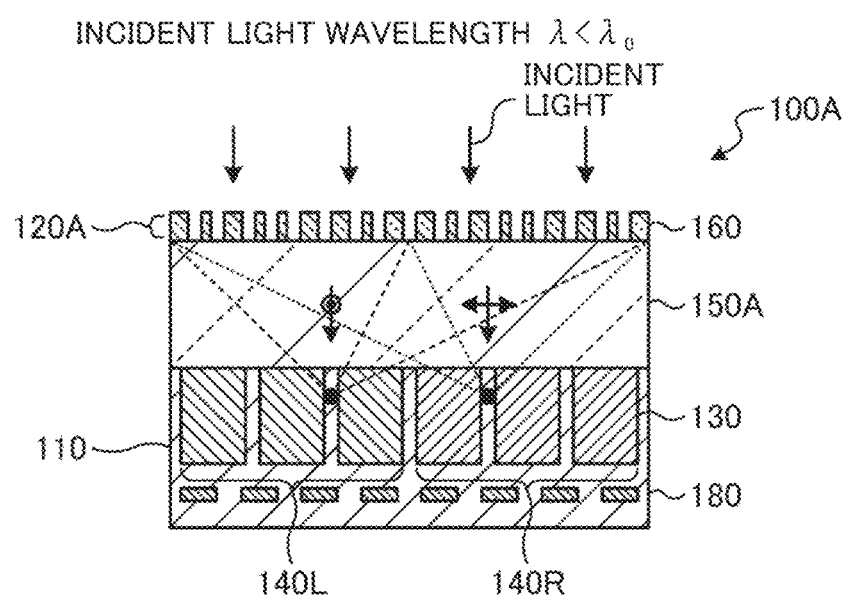
Figures 2, 3:
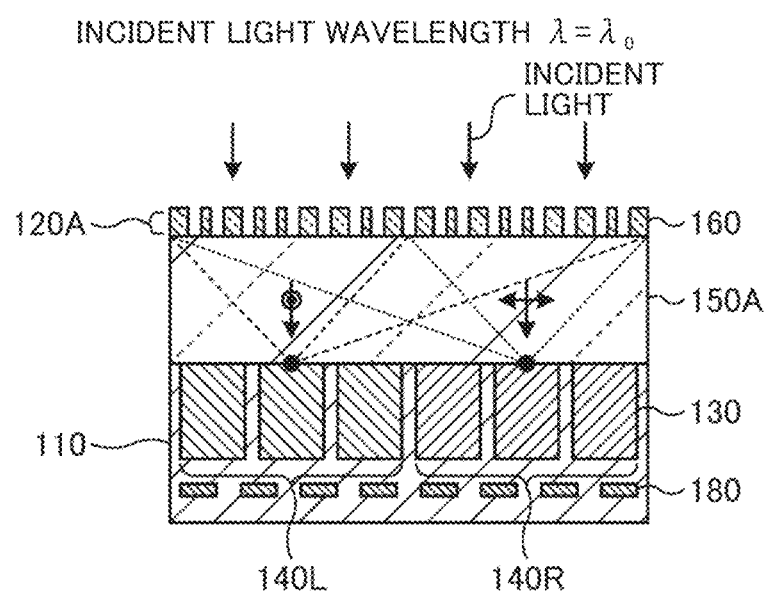
Figure 3:
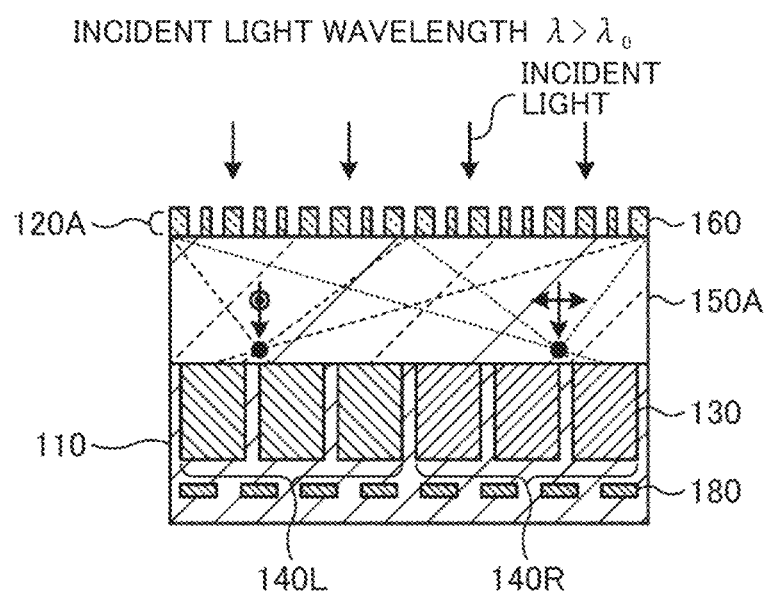

The imaging element 12 according to the embodiment will be schematically described below. The imaging element 12 according to the embodiment includes a pixel array in which pixels are placed in a two-dimensional array, the pixel including a photoelectric conversion element, and a polarization-wavelength separation lens array (spectral element array) in which polarization-wavelength separation lenses (spectral elements) are two-dimensionally placed. FIGS. 2-1 to 2-3 schematically illustrate a part of the pixel array and the polarization-wavelength separation lens array of the imaging element in cross section according to the embodiment. In FIGS. 2-1 to 2-3, a part of the imaging element 12 is illustrated as an imaging element 100.

FIGS. 2-1 to 2-3 illustrate unpolarized light that is incident on a sensor with different wavelengths A in the imaging element 100. In the imaging element 100 according to the embodiment, a polarization-wavelength separation lens array 120 is opposed to a pixel array 110 and is disposed on one side where light enters from the lens optical system 11. The polarization-wavelength separation lens array 120 includes polarization-wavelength separation lenses 160 placed in a two-dimensional array at the bottom of a transparent substrate 170. The pixel array 110 has a wire layer 180 and pixels 130 including photoelectric conversion elements placed in a two-dimensional array.

The polarization-wavelength separation lenses 160 each include a plurality of microstructures that have an equal thickness (a length in z-axis direction in FIGS. 2-1 to 2-3) and condense incident light at different positions on the pixel array 110 according to the polarization direction and wavelength components of the incident light. The design wavelength of the microstructure is set at $\lambda_0$. FIG. 2-1 illustrates incident light with a wavelength $\lambda$ ($<\lambda_0$) in the imaging element 100, FIG. 2-2 illustrates incident light with a wavelength $\lambda$ ($=\lambda_0$) in the imaging element 100, and FIG. 2-3 illustrates incident light with a wavelength $\lambda$ ($>\lambda_0$) in the imaging element 100.

In the example of FIGS. 2-1 to 2-3, the polarization-wavelength separation lenses 160 separate the polarization direction of light incident on the imaging element 100 into a first polarization direction (see direction Y1), which is optionally determined, and a second polarization direction (see direction Y2) orthogonal to the first polarization direction. Moreover, the polarization-wavelength separation lenses 160 classifies incident light on the imaging element 100 into respective wavelength regions, that is, a first wavelength region, a second wavelength region, and a third wavelength region. The combination of the first to third wavelength regions is typically three primary colors: red (R), green (G), and blue (B). The combination is not limited thereto. The number of classified wavelength regions may be increased or reduced according to the purpose of use.

The polarization-wavelength separation lenses 160 use a phase delay effect, which depends on polarization caused by the microstructures of the polarization-wavelength separation lenses 160 which will be described later, and the dependence on structural dimensions, so that as illustrated in FIGS. 2-1 to 2-3, the polarization-wavelength separation lenses 160 have a polarization separation function of changing the propagation direction of incident light according to the first polarization direction and the second polarization direction so as to spatially split the incident light for each polarization component and guiding the split light to different positions on the pixel array 110 according to the wavelength ranges. Moreover, the polarization-wavelength separation lenses 160 have an off-axis lens function, so that light split according to the polarization direction can be condensed to a different position on the pixel array 110 and as will be described later, the condensing position is shifted according to the wavelength.

In other words, because of the polarization separation function and the off-axis lens function, the polarization-wavelength separation lenses 160 have the functions of polarization separation and wavelength separation. Thus, light incident on the polarization-wavelength separation lenses 160 is condensed to different positions on the pixel array 110 according to the polarization direction and the wavelength components without reducing the total amount of light.

Specifically, in the example illustrated in FIG. 2-1, a distance $z_f$ between the polarization-wavelength separation lenses 160 and the pixel array 110 in z-axis direction is properly set, so that only light in the first polarization direction is received by a pixel unit 140L (first pixel unit) that is disposed immediately under the polarization-wavelength separation lenses 160 and includes three pixels on the left side of FIG. 2-1, whereas only light in the second polarization direction is received by a pixel unit 140R (second pixel unit) including three pixels on the right side of FIG. 2-1. The pixel unit 140L is disposed at the condensing positions of polarization components in the first polarization direction, out of light incident on the polarization-wavelength separation lenses 160. The pixel unit 140R is disposed at the condensing positions of polarization components in the second polarization direction, out of light incident on the polarization-wavelength separation lenses 160.

Furthermore, because of the wavelength dependence of the condensing position, the pixels of the pixel unit 140L on the left side receive different wavelength components. Likewise, the pixels of the pixel unit 140R on the right side receive different wavelength components. The layout positions of the pixels of the pixel units 140L and 140R are set according to the wavelength dependence of the condensing position. Moreover, as will be described later, the light-receiving areas of the pixels of the pixel units 140L and 140R are set according to the wavelength dependence of the condensing position.

When light enters each of the pixels 130, the photoelectric conversion element outputs an electric signal (photoelectric conversion signal) according to the intensity of the incident light. Hence, the signal processing unit 13 can extract first polarization-direction components from the photoelectric conversion signal of the pixel unit 140L on the left side and performs a signal processing such as a matrix operation and an inverse problem solution on the photoelectric conversion signal of the pixel unit 140L on the left side, thereby reproducing color information with different wavelength components. Likewise, the signal processing unit 13 can extract second polarization-direction components from the photoelectric conversion signal of the pixel unit 140R on the right side and performs a signal processing such as a matrix operation and an inverse problem solution on the photoelectric conversion signal of the pixel unit 140R on the right side, thereby reproducing color information with different wavelength components.

Effects of Embodiment

As described above, the polarization-wavelength separation lenses 160 and the pixels corresponding to the polarization-wavelength separation lenses 160 are two-dimensionally placed in the imaging element 100, thereby simultaneously acquiring polarization information and color information about the optical image of the object 1, the optical image being formed by the lens optical system 11. Moreover, the first polarization direction and the second polarization direction that are separated by the polarization-wavelength separation lenses 160 are optionally set for each of the polarization-wavelength separation lenses 160, thereby simultaneously acquiring information about various polarization direction components on the pixel array 110.

The imaging element 100 according to the embodiment can acquire polarization information and color information about the optical image of the object 1 by light separation of polarization components and wavelength components through the polarization-wavelength separation lenses 160. Specifically, if the first polarization direction is set at 0° and 45° and the first to third wavelength regions include three primary colors: R, G, and B, the imaging element 100 can simultaneously acquire a color image and a polarization direction image and a polarization degree image of each color.

Furthermore, no filter is used for the imaging element 100, which can maximize the light utilization efficiency and obtains higher imaging sensitivity as compared with the conventional imaging element using the filter array of two layers.

Moreover, the imaging element 100 can acquire color information and polarization information with a simple configuration only including the polarization-wavelength separation lenses 160 of the single layer. This configuration achieves higher productivity with a smaller number of components as compared with the conventional imaging element using the filter array of two layers, thereby reducing the cost.

The polarization-wavelength separation lenses 160 are not limited to the foregoing configuration and may vary in number, interval, structure shape, and layout pattern. Alternatively, the microstructures constituting the polarization-wavelength separation lenses 160 may be connected to one another or embedded in a transparent material.

In FIGS. 2-1 to 2-3, six pixels are located immediately under each of the polarization-wavelength separation lenses 160. The configuration is not limited thereto. The imaging element 100 may be provided with known constituent elements such as a microlens and a light-shielding wall. The illustration of the constituent elements is omitted in FIGS. 2-1 to 2-3 because the description is not particularly necessary for understanding of the outline of the present embodiment.

In FIGS. 2-1 to 2-3, the polarization-wavelength separation lens array 120 is formed at the bottom of the independent transparent substrate 170 and is opposed to the pixel array 110 with a transparent layer 150 interposed between the polarization-wavelength separation lens array 120 and the pixel array 110. The configuration is not limited thereto. FIGS. 3-1 to 3-3 schematically illustrate another example of a part of the pixel array and the polarization-wavelength separation lens array of the imaging element in cross section according to the embodiment. For example, as illustrated in an imaging element 100A of FIGS. 3-1 to 3-3, the polarization-wavelength separation lens array 120A may be formed on the top surface of a transparent layer 150A formed on the pixel array 110 and may be opposed to the pixel array 110. The same applied to the following description.

The present embodiment will be specifically described below with reference to the accompanying drawings.

Embodiment 1

The configuration of the imaging element according to Embodiment 1 will be schematically described below.
[Configuration of Imaging Element]

Figure 4:
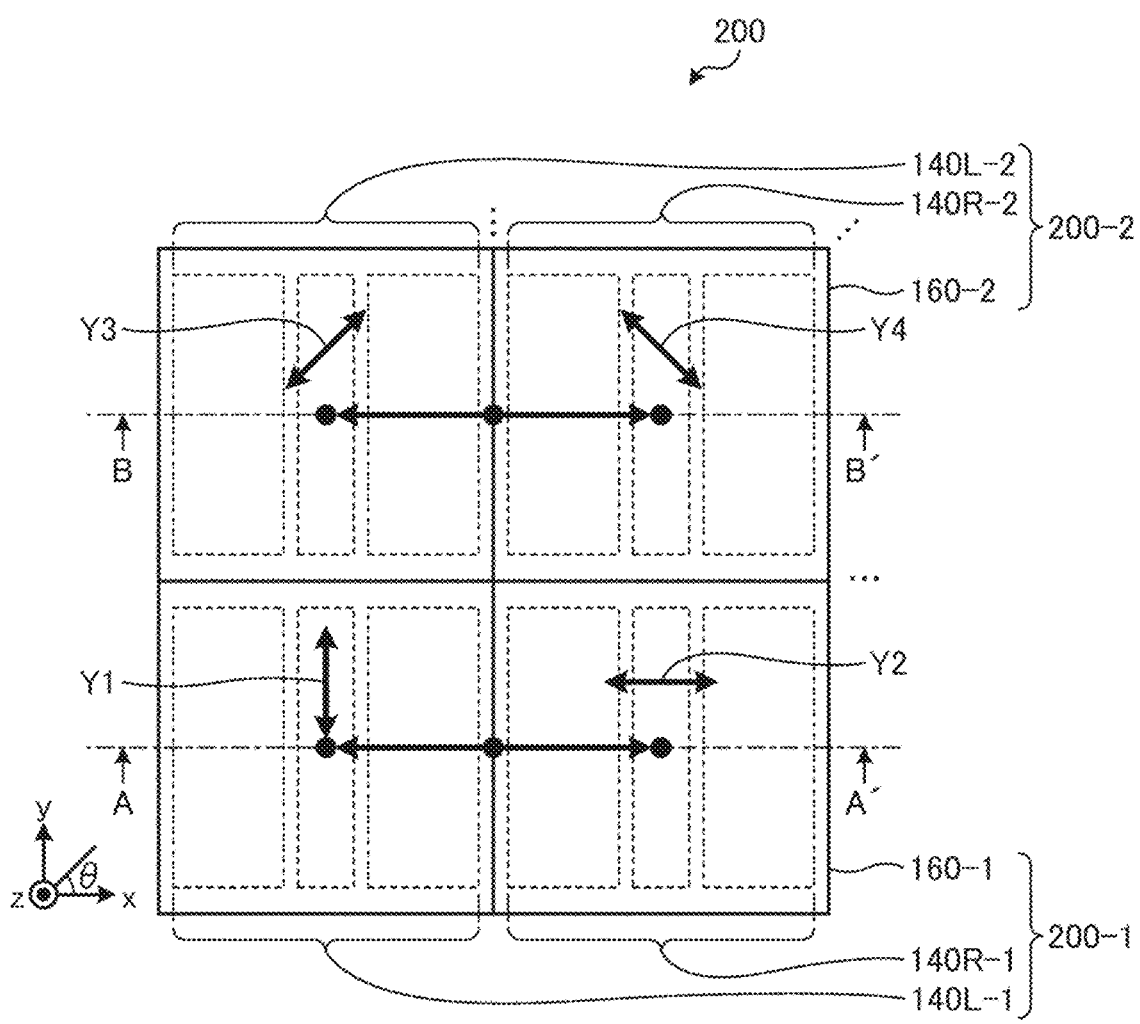
FIG. 4 is a plan view illustrating the schematic configuration of a part of the imaging element according to Embodiment 1.
Figures 1, 5:
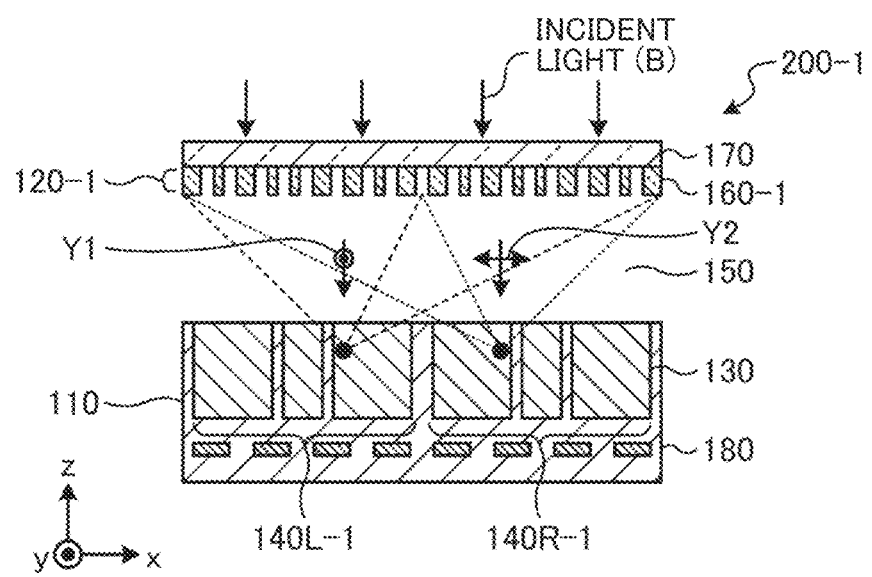
Figures 2, 5:
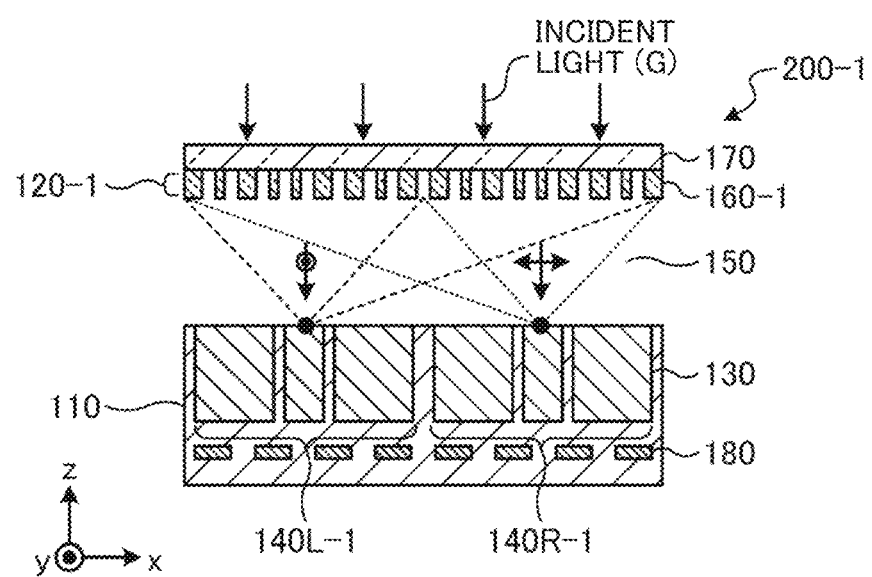
Figures 3, 5:
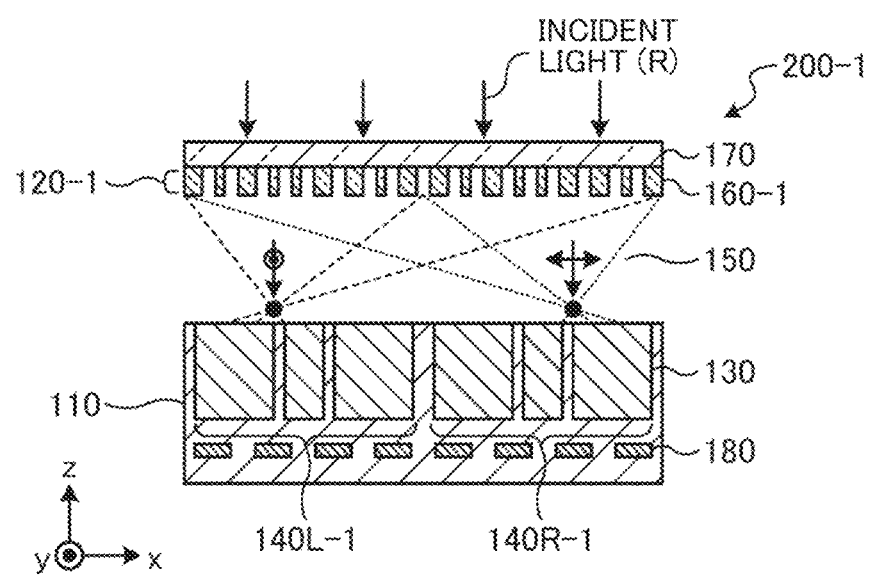
Figures 1, 6:
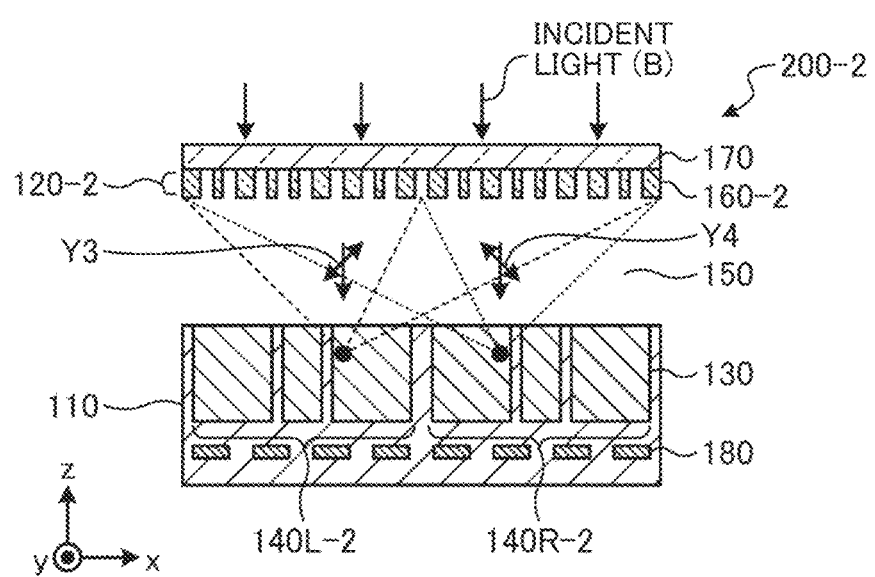
Figures 2, 6:
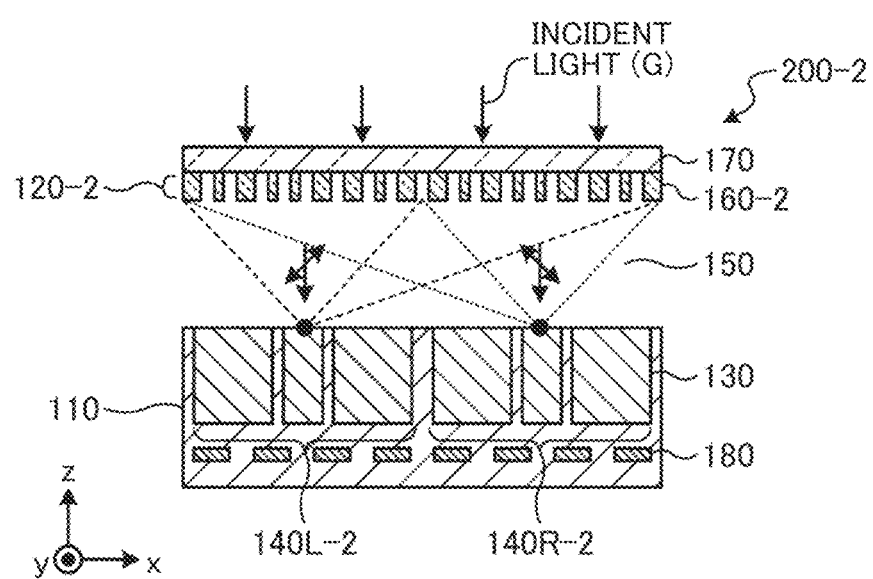
Figures 3, 6:
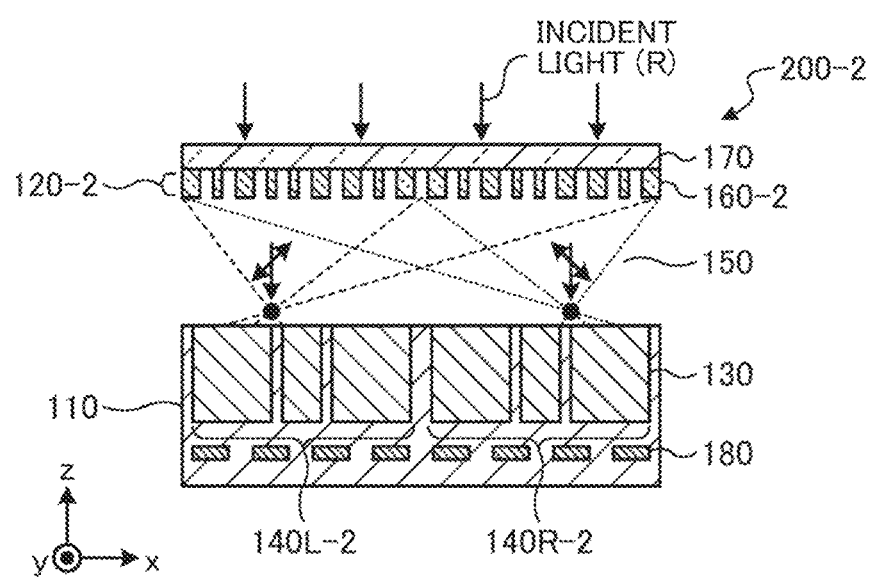

FIG. 4 is a plan view illustrating the schematic configuration of a part of the imaging element according to Embodiment 1. FIGS. 5-1 to 5-3 are cross-sectional views taken along line A-A' of FIG. 4. FIGS. 6-1 to 6-3 are cross-sectional views taken along line B-B' of FIG. 4.

As illustrated in FIG. 4, FIGS. 5-1 to 5-3, and FIGS. 6-1 to 6-3, in an imaging element 200 according to Embodiment 1, the transparent layer 150 and polarization-wavelength separation lens arrays 120-1 and 120-2 are stacked on the pixel array 110. In the pixel array 110, the pixels 130 are placed in a two-dimensional array, the pixel 130 including a photoelectric conversion element. The polarization-wavelength separation lens arrays 120-1 and 120-2 have microstructure patterns and are made of materials such as SiN and $TiO_2$ having higher refractive indexes than the transparent layer 150. The transparent layer 150 is air or a transparent layer made of materials such as $SiO_2$ with a low refractive index.

For convenience, an xyz rectangular coordinate system is set in the following description. In the rectangular coordinate system, the z-axis is a vertical direction with respect to the pixel array surface of the pixel array 110, the x-axis (horizontal direction) is a direction in which the three pixels 130 constituting pixel units 140L-1, 140R-1, 140L-2, and 140R-2 are placed in parallel with the pixel array 110, and the y-axis (vertical direction) is a direction orthogonal to the x-axis. Moreover, an angle θ is set with respect to the x-axis on an xy plane parallel to the pixel array surface of the pixel array 110.

FIG. 4 illustrates an example in which the pixels of the pixel array 110 are rectangular with a long axis extending along the y-axis direction and some of the pixels have different sizes. The array, shapes, and sizes of the pixels are not limited to the example of FIG. 4 depending on the element areas and spectral performance of first polarization-wavelength separation lens 160-1 and second polarization-wavelength separation lens 160-2. In other words, a pixel array including pixels of the same size may be used. The first polarization-wavelength separation lens 160-1 and the second polarization-wavelength separation lens 160-2 may be collectively called the polarization-wavelength separation lenses 160.

As illustrated in the drawings, in the imaging element 200, the polarization-wavelength separation lens array 120-1 is formed by the first polarization-wavelength separation lens 160-1 that splits incident light in a polarization direction parallel to the x-axis direction and the y-axis direction and condenses the light. In the imaging element 200, the polarization-wavelength separation lens array 120-2 is formed by the second polarization-wavelength separation lens 160-2 that splits incident light in a polarization direction parallel to the direction of θ=45° and the direction of θ=−45° and condenses the light. The polarization-wavelength separation lens arrays 120-1 and the polarization-wavelength separation lens arrays 120-2 are disposed in a lattice pattern on the xy plane.

Moreover, the polarization-wavelength separation lens and adjacent pixels immediately under the lens serve as a polarization unit. Specifically, the first polarization-wavelength separation lens 160-1 and the pixel units 140L-1 and 140R-1, each of which includes three adjacent pixels immediately under the lens, serve as a first polarization unit 200-1. The second polarization-wavelength separation lens 160-2 and the pixel units 140L-2 and 140R-2, each of which includes three adjacent pixels immediately under the lens, serve as a second polarization unit 200-2. The pixel units 140L-1, 140R-1, 140L-2, and 140R-2 may be collectively called pixel units 140.

Furthermore, the pixel unit 140L-1 on the left side of the first polarization unit 200-1 including the first polarization-wavelength separation lens 160-1 serves as a 90°-polarization pixel group, whereas the pixel unit 140R-1 on the right side serves as a 0°-polarization pixel group. The pixel unit 140L-2 of the second polarization unit 200-2 including the second polarization-wavelength separation lenses 160-2 serves as a 45°-polarization pixel group, whereas the pixel unit 140R-2 on the right side serves as a −45°-polarization pixel group.

In the foregoing example, the polarization-wavelength separation lenses having the same function are placed along the x-axis direction. The first polarization-wavelength separation lens 160-1 and the second polarization-wavelength separation lens 160-2 are alternately placed along the y-axis direction. The first polarization-wavelength separation lens 160-1 and the second polarization-wavelength separation lens 160-2 are rectangular with the same area. The arrays, shapes, and sizes of the elements are not limited to this example. The elements may have various arrays, shapes, and sizes. For example, the first polarization-wavelength separation lens 160-1 and the second polarization-wavelength separation lens 160-2 may be disposed in a checkered pattern.

The imaging element 200 illustrated in FIGS. 4, 5-1 to 5-3, and 6-1 to 6-3 has a back-illuminated structure that receives light from the opposite side from the wire layer 180. The present embodiment is not limited to this structure and may have a front-illuminated structure that receives light from the wire layer 180. The imaging element 200 may have an uneven structure made of materials such as SiN and $TiO_2$ with a high refractive index. The uneven structure operates as an internal microlens between the pixel array 110 and the first polarization-wavelength separation lens 160-1 or the second polarization-wavelength separation lens 160-2 and guides light from the first polarization-wavelength separation lens 160-1 or the second polarization-wavelength separation lens 160-2 to the photoelectric conversion elements in the pixels. The uneven structure is not illustrated in FIGS. 4, 5-1 to 5-3, and 6-1 to 6-3. The structures illustrated in FIGS. 4, 5-1 to 5-3, and 6-1 to 6-3 can be manufactured by known semiconductor manufacturing techniques.

The functions of the constituent elements of the imaging element 200 according to the embodiment will be described below.

Light incident on the imaging element 200 is first split into polarization components in the x-axis direction or the direction of θ=45° and a direction orthogonal thereto in each of the first polarization unit 200-1 and the second polarization unit 200-2 through the polarization-wavelength separation lenses, and then the light is condensed onto the corresponding pixel group. Thus, in the two kinds of the first polarization unit 200-1 and the second polarization unit 200-2, the incident light enters the four different pixel units so as to be spatially split into the polarization components in the x-axis (θ=0°) direction (see the direction Y2 in FIG. 5-1), the y-axis (θ=90°) direction (see the direction Y1 in FIG. 5-1), the direction of θ=45° (see a direction Y3 in FIG. 6-1), and the direction of θ=−45° (see a direction Y4 in FIG. 6-1).

The foregoing description is merely exemplary. The polarization direction for splitting can be freely changed depending on the configurations of the polarization-wavelength separation lenses. Because of the wavelength dependence of a condensing position on each pixel group, the pixels constituting each pixel group receive different wavelength components of light. The wavelength dependence is caused by an off-axis lens, which will be described later.

Embodiment 1 describes the first polarization-wavelength separation lens 160-1 and the second polarization-wavelength separation lens 160-2, by which light having a wavelength corresponding to green (G) is condensed at the central pixel in each of the pixel units 140. Hence, the central pixel in each of the pixel units 140 receives light including many wavelength components of green (G). Left and right pixels in each of the pixel units 140 receive light including many wavelength components of blue (B) or red (R).

More specifically, the right pixel in the pixel unit 140L-1 serving as a 90°-polarization pixel group receives light including many wavelength components of B (FIG. 5-1), the central pixel receives light including many wavelength components of G (FIG. 5-2), and the left pixel receives light including many wavelength components of R (FIG. 5-3).

Thereafter, photoelectric conversion is performed by the photoelectric conversion elements in the pixels 130, and three signals including wavelength information about corresponding polarization direction components are outputted from each of the pixel units 140. The signal processing unit 13 applies signal processing based on a matrix operation and an inverse problem solution or the like (for example, see NPL 3) to the three signals including the wavelength information, so that color information about RGB is extracted.

In the example of FIG. 4, the signal processing unit 13 can acquire polarization component information, by performing this signal processing, about light incident on the two kinds of the first polarization unit 200-1 and the second polarization unit 200-2 in the x-axis ($\theta=0°$) direction, the y-axis ($\theta=90°$) direction, the direction of $\theta=45°$, and the direction of $\theta=-45°$ and color information about the incident light. The two kinds of the first polarization unit 200-1 and the second polarization unit 200-2 each form an array on a two-dimensional plane, thereby acquiring two-dimensional space information about polarization component information about a subject imaged on the imaging element 200 and color information about the subject. Thus, from the two-dimensional space information, the signal processing unit 13 can obtain a light intensity image (normal color image), a polarization direction image, and a polarization degree image for each color of RGB.

[Polarization-Wavelength Separation Lens]

The first polarization-wavelength separation lens 160-1 and the second polarization-wavelength separation lens 160-2 according to Embodiment 1 will be described below.

The polarization-wavelength separation lens 160 according to Embodiment 1 includes a microstructure pattern. The microstructure pattern may be a pattern including at least one columnar structure (microstructure), a pattern including at least one hole structure, or the like. If a pattern including multiple columnar structures is used in the polarization-wavelength separation lens 160, an interval between the columnar structures is desirably shorter than the wavelength of light to be detected or the wavelength of incident light. The microstructure pattern in the polarization-wavelength separation lens 160 may be embedded in the transparent material of the transparent layer 150.

Specifically, in the following example, it is described that multiple fine columnar structures formed on the surface of an independent transparent substrate constitute the polarization-wavelength separation lens 160.

Figure 7:
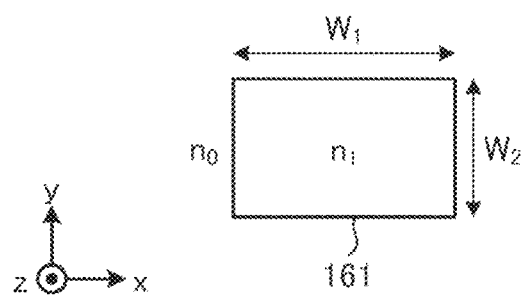
FIG. 7 is a plan view illustrating a columnar structure constituting a polarization-wavelength separation lens according to Embodiment 1.
Figure 8:
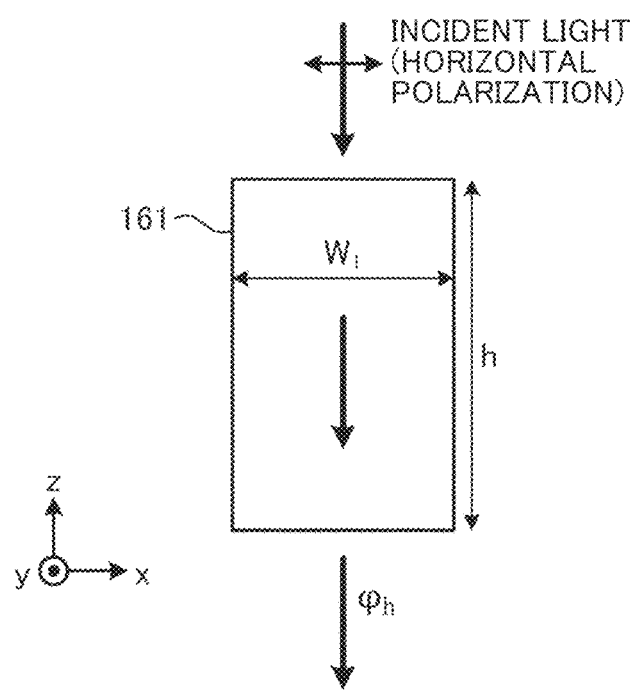
FIG. 8 is a side view illustrating the columnar structure constituting the polarization-wavelength separation lens according to Embodiment 1.
Figure 9:
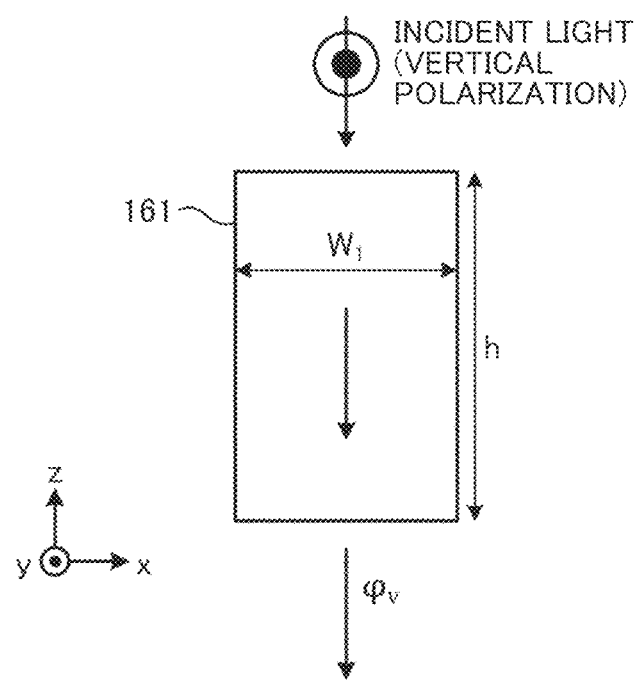
FIG. 9 is a side view illustrating the columnar structure constituting the polarization-wavelength separation lens according to Embodiment 1.

FIG. 7 is a plan view illustrating the columnar structure constituting the polarization-wavelength separation lens 160 according to Embodiment 1. FIGS. 8 and 9 are side views illustrating the columnar structure constituting the polarization-wavelength separation lens 160 according to Embodiment 1.

The polarization-wavelength separation lens 160 includes a plurality of columnar structures 161 illustrated in FIGS. 7 to 9. The columnar structure 161 is made of a material having a refractive index $n_1$ higher than a refractive index $n_0$ of a material or a space around the structure. The thickness of the structure, that is, a length h in the z-axis direction is fixed. As indicated in FIG. 7, the bottom and the top surface of the columnar structure 161 are rectangular with a width $w_1$ in the x-axis direction and a width $w_2$ in the y-axis direction. The columnar structure 161 acts as an optical waveguide for trapping light in the structure and propagating the light therein, due to a refractive index difference from the material or the space around the structure.

Thus, light entering from one structure side (e.g., the top surface) of the columnar structure 161 propagates while being securely trapped in the structure. At this point, as illustrated in FIGS. 8 and 9, the incident light propagates while being affected by a phase delay effect, which is determined by an effective refractive index $n_{eff}$ of the optical waveguide, and is finally outputted from the other structure side (bottom). In this case, with respect to the phase of light propagated through the material or space around the columnar structure 161 by a length equivalent to the thickness of the structure, a phase delay amount $\varphi$ by the columnar structure is expressed by Formula (1) where $\lambda$ is a wavelength of light in vacuo.

[Math. 1]

$$\varphi=(n_{eff}-n_0)\times 2\pi h/\lambda \qquad (1)$$

In this case, a refractive index $n_{eff}$ is a function of structural dimensions. It is known that some structure shapes may cause heavy polarization dependence. In the example of the columnar structure 161, the rectangular structure in cross section in FIG. 7 can independently provide a different refractive index $n_{eff}$ for orthogonal incoming polarization.

In this case, $\varphi_h$ denotes a phase delay amount relative to polarization components in the lateral direction (x-axis direction) of the plan view in FIG. 7, $\varphi_v$ denotes a phase delay amount relative to polarization components in the vertical direction (y-axis direction), $n_{effh}$ denotes an effective refractive index relative to polarization components in the lateral direction (x-axis direction), $n_{effv}$ denotes an effective refractive index relative to polarization components in the vertical direction (y-axis direction), $w_1$ denotes the width of a column in a direction parallel to the lateral direction (x-axis direction), and $w_2$ denotes the width of the column in a direction parallel to the vertical direction (y-axis direction). It is known that the refractive index $n_{effh}$ and the refractive index $n_{effv}$ at this point can be controlled by a combination of the width $w_1$ and the width $w_2$. The refractive indexes have the values of $n_0<n_{effh}<n_1$ and $n_0<n_{effv}<n_1$, respectively.

Thus, according to Formula (1), the phase delay amount $\varphi_h$ and the phase delay amount $\varphi_v$ can be optionally controlled by a combination of the width $w_1$ and the width $w_2$. In other words, in the example illustrated in FIGS. 7 to 9, the phase delay amounts $\varphi_h$ and $\varphi_v$ relative to the polarization directions can be optionally set by designing the width $w_1$ and the width $w_2$ of the columnar structure 161.

As described above, in the imaging element 200, the columnar structures 161 having the proper widths $w_1$ and $w_2$ are disposed as the polarization-wavelength separation lens 160 in accordance with the position on the plane of x-axis and y-axis, thereby providing any phase-delay space distribution for the polarization directions. This can perform any wavefront control on the polarization directions.

In order to perform any wavefront control, the variable range of a phase delay amount by the columnar structure 161 relative to the polarization directions is preferably equal to or larger than the range of 0 to $2\pi$. In view of the production method and the production cost, it is preferable to minimize the length h of the columnar structure 161 in the z-axis direction. Thus, according to Formula (1), the length h of the columnar structure in the z-axis direction is desirably set around $h=\lambda/(n_1-n_0)$ where $\lambda$ is the wavelength of light incident on the imaging element 200.

Figures 1, 10:
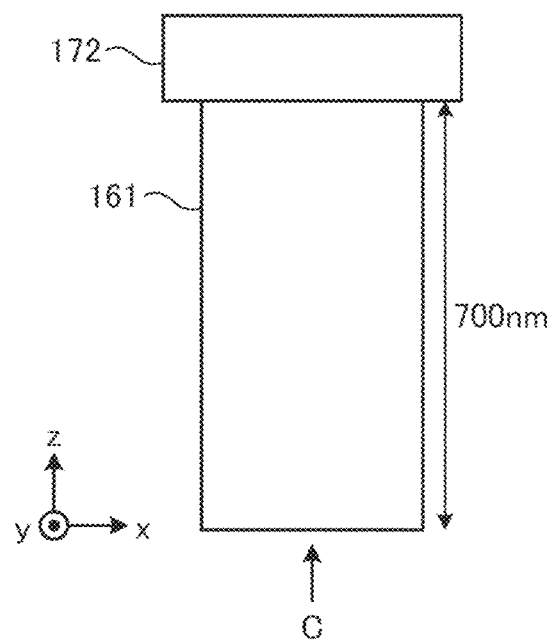
Figures 2, 10:
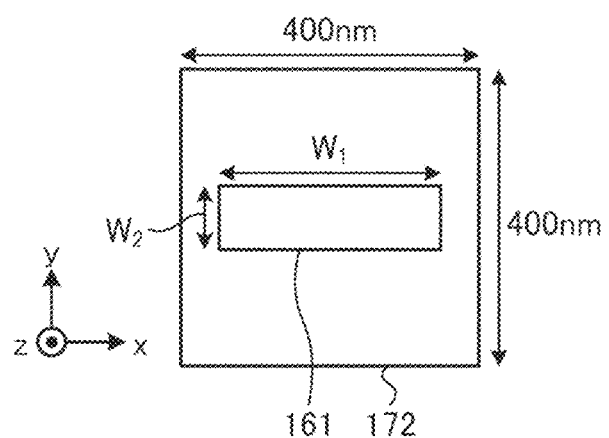

A specific example of the columnar structure 161 of the polarization-wavelength separation lens 160 will be described below. FIG. 10-1 indicates an example of a side view illustrating the columnar structure of the polarization-wavelength separation lens 160 according to Embodiment 1. FIG. 10-2 is a view taken along an arrow C of FIG. 10-1. As illustrated in FIGS. 10-1 and 10-2, for example, the columnar structure 161 is formed at the bottom of a quartz substrate 172.

Figure 11:
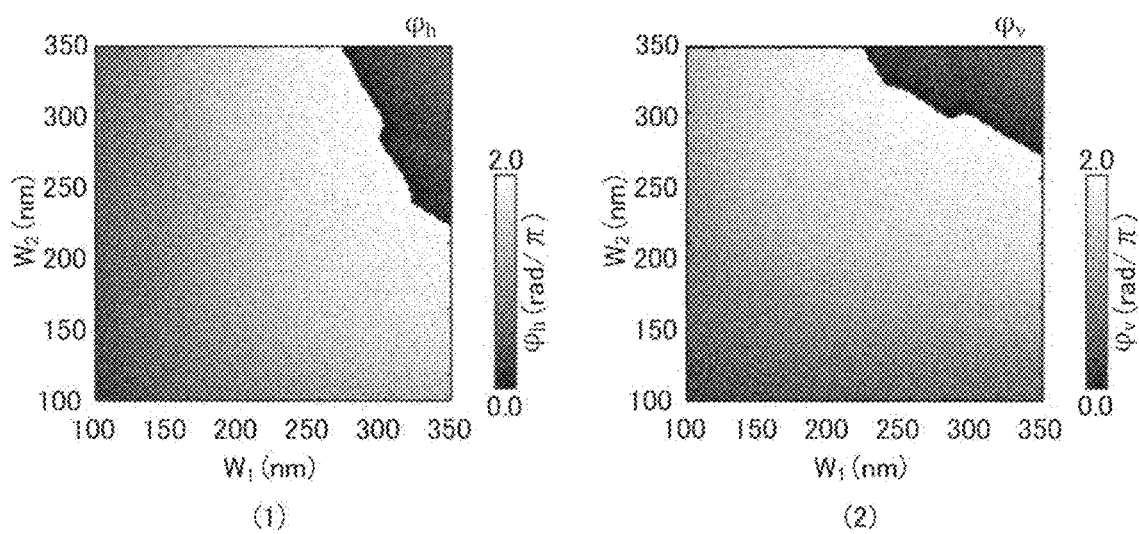
FIG. 11 indicates the calculation results of phase delay characteristics in the columnar structure illustrated in FIGS. 10-1 and 10-2.
Figure 12:
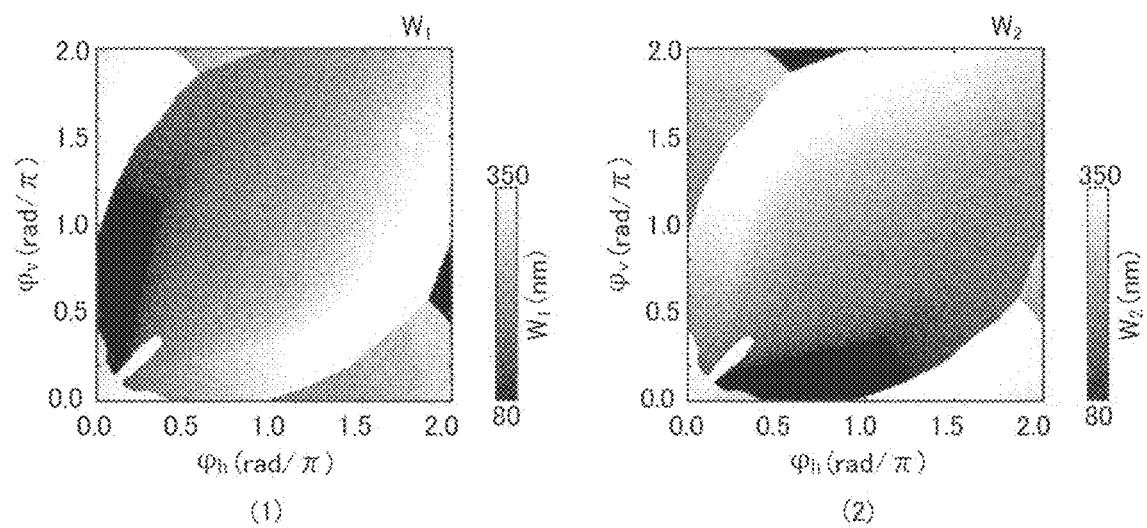
FIG. 12 indicates the calculation results of phase delay characteristics in the columnar structure illustrated in FIGS. 10-1 and 10-2.

FIGS. 11 and 12 indicate the calculation results of phase delay characteristics in the columnar structure 161 illustrated in FIGS. 10-1 and 10-2. It is assumed that the columnar structure 161 is made of SiN ($n_1$=2.03) and the transparent layer 150 disposed between and under the columnar structures 161 is composed of air ($n_0$=1.0). The columnar structures 161 may be embedded in a single transparent layer 150A.

As illustrated in FIGS. 10-1 and 10-2, the height of the columnar structure 161 (a length in the z-axis direction) is h=700 nm, and the interval of the columnar structure 161 is 400 nm. The calculation of the phase delay characteristics is based on a rigorous coupling theory. The phase delay amount $\varphi_h$ and the phase delay amount $\varphi_v$ are determined as the functions of the widths $w_1$ and $w_2$, the phase delay amounts $\varphi_h$ and $\varphi_v$ being obtained when a plane wave with a wavelength λ=520 nm enters from the substrate side.

FIG. 11 is a heat map in which the values of phase delay amounts are represented in density levels for each combination of the width $w_1$ of the columnar structure 161 of the polarization-wavelength separation lens 160 in the x-axis direction and the width $w_2$ of the columnar structure 161 in the y-axis direction. (1) in FIG. 11 corresponds to the phase delay amount $\varphi_h$, and (2) in FIG. 11 corresponds to the phase delay amount $\varphi_v$. Based on the relationship between the width $w_1$ and the width $w_2$ and the phase delay amount $\varphi_h$ and the phase delay amount $\varphi_v$ in (1) and (2) of FIG. 11, the combination of the width $w_1$ and the width $w_2$ of the columnar structure 161 is adjusted, thereby achieving various combinations of the phase delay amount $\varphi_h$ and the phase delay amount $\varphi_v$.

FIG. 12 is a heat map in which the width $w_1$ of the columnar structure 161 in the x-axis direction or the width $w_2$ of the columnar structure 161 in the y-axis direction is represented in density levels for any combination of the phase delay amount $\varphi_h$ and the phase delay amount $\varphi_v$ (the range of 0 to 2π). (1) in FIG. 12 corresponds to the width $w_1$ of the columnar structure 161 in the x-axis direction, and (2) in FIG. 12 corresponds to the width $w_2$ of the columnar structure 161 in the y-axis direction. The relationship between the widths $w_1$ and $w_2$ and the combination of the phase delay amount $\varphi_h$ and the phase delay amount $\varphi_v$ is determined from the calculation results indicated in FIG. 11. From FIG. 12, the shapes and layout of the columnar structures 161 may be determined so as to match the phase-delay space distribution suitable for any wavefront control including the polarization separation function and the off-axis lens function.

Figure 13:
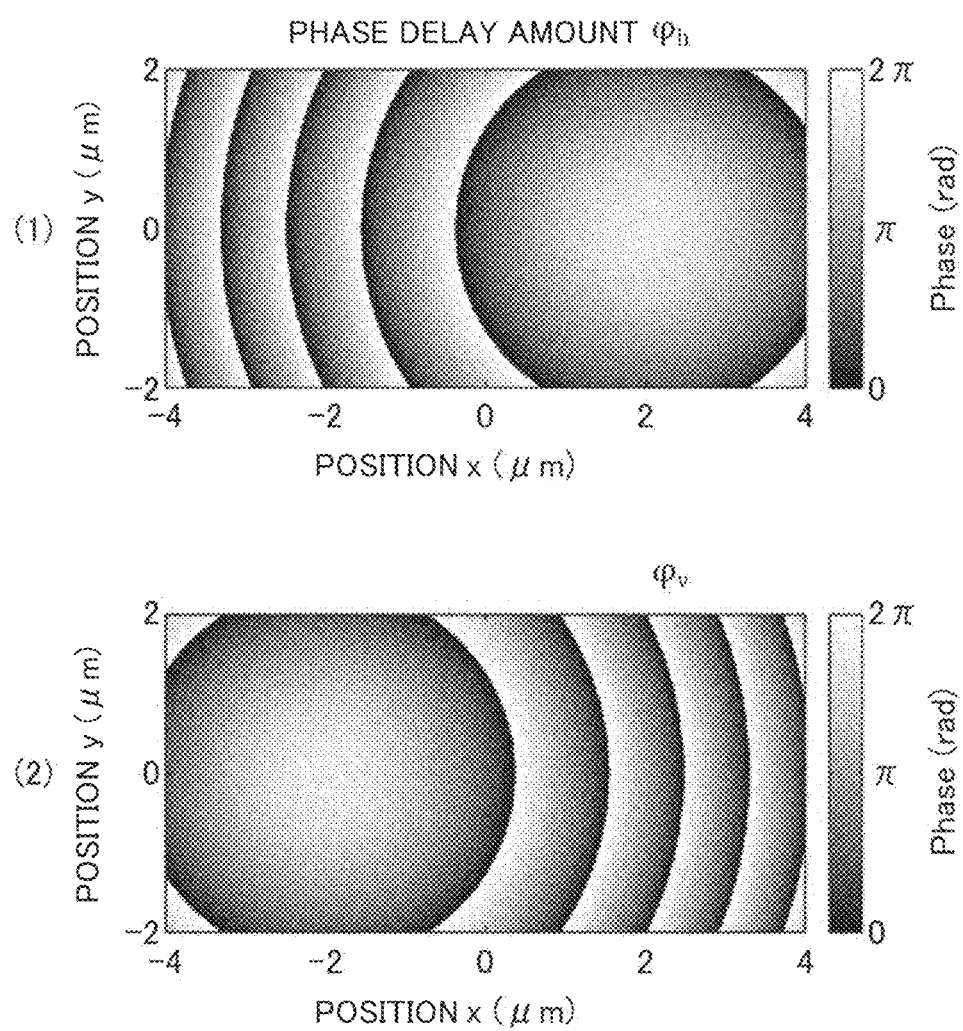
FIG. 13 illustrates an example of an ideal phase-delay space distribution for implementing the polarization-wavelength separation lens according to Embodiment 1.

FIG. 13 illustrates an example of an ideal phase-delay space distribution for implementing the polarization-wavelength separation lens 160 according to Embodiment 1. If the central coordinates of the lens are x=0 μm and y=0 μm, a distance between the lens and the pixel (a focal distance along the z-axis) is $z_f$=6 μm, a distance between the lens center and a light spot along the x-axis (a focal distance along the x-axis) is $x_f$=2 μm, and a design center wavelength is $\lambda_0$=520 nm, an example of a phase-delay space distribution for implementing the functions of polarization separation and the off-axis lens is expressed by Formula (2) and Formula (3).

[Math. 2]

$$\varphi_h(x,y)=-(2\pi n_0/\lambda_0)\times\{((x-x_f)^2+y^2+z_f^2)^{1/2}-(x_f^2+z_f^2)^{1/2}\} \quad (2)$$

[Math. 3]

$$\varphi_v(x,y)=-(2\pi n_0/\lambda_0)\times\{((x+x_f)^2+y^2+z_f^2)^{1/2}-(x_f^2+z_f^2)^{1/2}\} \quad (3)$$

FIG. 11 indicates the phase delay amount $\varphi_h$ and the phase delay amount $\varphi_v$ that are mapped on the two-dimensional plane (on the xy plane) according to Formula (2) and Formula (3). The phase delay amounts $\varphi_h$ and $\varphi_v$ are indicated in the range of 0 to 2π. The aperture of the lens is 8 μm in the horizontal direction and 4 μm in the vertical direction.

Figure 14:
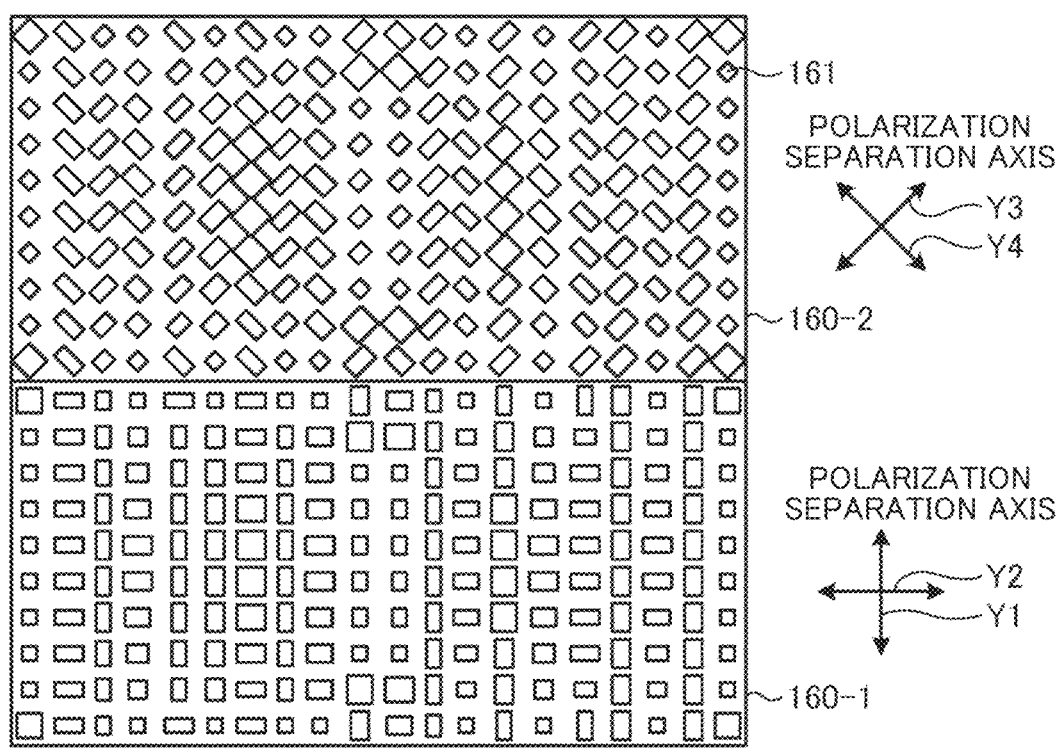
FIG. 14 illustrates a layout example of the columnar structures constituting the polarization-wavelength separation lens according to Embodiment 1.

FIG. 14 illustrates a layout example of the columnar structures 161 constituting the polarization-wavelength separation lens 160 according to Embodiment 1. FIG. 14 is a plan view of the columnar structures constituting the polarization-wavelength separation lens 160. FIG. 14 illustrates the layout example of the columnar structures 161 that are placed on the xy plane so as to match the ideal phase-delay space distribution.

FIG. 14 illustrates the layout example in which the first polarization-wavelength separation lens 160-1 and the second polarization-wavelength separation lens 160-2 are vertically placed. The first polarization-wavelength separation lens 160-1 splits incident light in a polarization direction (see the direction Y2) parallel to the x-axis direction and a polarization direction (see the direction Y1) parallel to the y-axis direction and condenses the light, and the second polarization-wavelength separation lens 160-2 splits incident light in a polarization direction (see the direction Y3) parallel to the direction of θ=45° with respect to the x-axis and a polarization direction (see the direction Y4) parallel to the direction of θ=−45° with respect to the x-axis and condenses the light.

The columnar structures 161 are placed at intervals (e.g., 400 nm) equal to or shorter than the design center wavelength $\lambda_0$ (=520 nm) in the x-axis direction and the y-axis direction. In the second polarization-wavelength separation lens 160-2, the columnar structures constituting the first polarization-wavelength separation lens 160-1 are rotated 45° on the xy plane.

As is evident from FIG. 14, the widths $w_1$ and $w_2$ of the columnar structures 161 vary among positions on the xy plane. The columnar structures 161 on the xy plane vary in size. The columnar structures 161 are sized on the xy plane such that light passing through the columnar structures is provided with different phase delay amounts in the respective polarization directions. The width dimensions of the columnar structures 161 vary on the xy plane, so that light passing through the first polarization-wavelength separation lens 160-1 and the second polarization-wavelength separation lens 160-2 can be provided with different two-dimensional phase delay distributions in the respective polarization directions orthogonal to one another and can change the light wave surface.

Thus, the phase-delay space distributions having the polarization separation function and the off-axis lens function as indicated by Formula (2) and Formula (3) are implemented in the microstructure pattern, thereby spatially splitting transmitted light according to the polarization direction and condensing the light at different positions. The foregoing description is merely exemplary. The combination of the polarization direction and the condensing position can be freely changed depending on the dimensions of the columnar structures.

Figure 15:
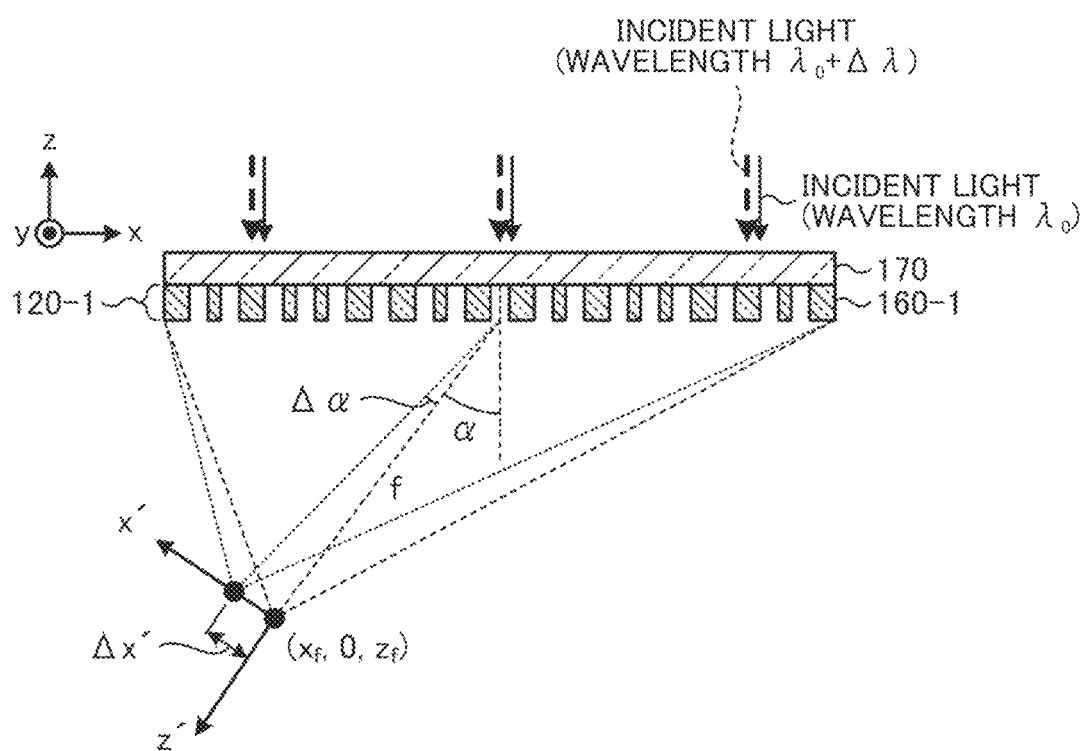
FIG. 15 schematically illustrates the shift of a condensing position when a wavelength is changed from a design center wavelength $\lambda_0$ by $\Delta\lambda$ in the polarization-wavelength separation lens.

The shift of the condensing position by the off-axis function according to a wavelength will be described below. FIG. 15 schematically illustrates the shift of the condensing position when the wavelength is changed from the design center wavelength $\lambda_0$ by $\Delta\lambda$ in the polarization-wavelength separation lens 160. For convenience, the propagation direction of light is the z-axis and y=0 is set in FIG. 15. As an example, light polarized by 90° vertically enters the first polarization-wavelength separation lens 160-1.

Based on the generalized Snell's law, the first polarization-wavelength separation lens 160-1 deflects incident light (wavelength $\lambda_0+\Delta\lambda$) at positions on the x-axis by an angle $\gamma(x)$ determined by Formula (4) (for details, see NPL 4).

[Math. 4]

$$\sin(\gamma(x)) = \{(\lambda_0 + \Delta\lambda)/2\pi\} \times d\varphi_v(x,0)/dx \quad (4)$$

Furthermore, it is assumed that $\varphi_v(x, 0)$ corresponds to Formula (3) and does not considerably change relative to a temperature change. By substituting Formula (3) into Formula (4), a deflection angle $\gamma(0)$ at x=0 is obtained as Formula (5).

[Math. 5]

$$\gamma(0) = \sin^{-1}\{(1+\Delta\lambda/\lambda_0) \times \sin(\alpha)\} \quad (5)$$

where $\alpha$ indicates a deflection angle at x=0 when light having the design center wavelength $\lambda_0$ enters the polarization-wavelength separation lens. $\alpha = \sin^{-1}(x_f/f)$ is obtained when $f = (x_f^2 + z_f^2)^{1/2}$ is set. If the deflection angle is changed by $\Delta\alpha$ at x=0 when the wavelength is changed by $\Delta\lambda$, that is, $\gamma(0) = \alpha + \Delta\alpha$ is determined, Formula (6) is obtained from Formula (5).

[Math. 6]

$$\Delta\alpha = \sin^{-1}\{(1+\Delta\lambda/\lambda_0) \times \sin(\alpha)\} - \alpha \quad (6)$$

Thus, Formula (7) indicates a condensing position shift $\Delta x'$ along the x'-axis (an axis perpendicular to light propagating at an angle $\alpha$) in FIG. 15 when the wavelength is changed by $\Delta\lambda$.

[Math. 7]

$$\Delta x' \approx f \times [\sin^{-1}\{(1+\Delta\lambda/\lambda_0) \times \sin(\alpha)\} - \alpha] \quad (7)$$

As is evident from Formula (7), the shift amount increases with the wavelength change $\Delta\lambda$. As described above, in the imaging element 200, the shift of the condensing position depending on the wavelength allows light having different wavelength components to be incident on the pixels 130 constituting the pixel units 140L-1, 140R-1, 140L-2, and 140R-2 immediately under the polarization-wavelength separation lens.

As is evident from Formula (7), the shift amount at the condensing position increases with a polarization angle $\alpha$ at the design wavelength. Thus, in order to increase the wavelength dependence of the polarization-wavelength separation lenses 160, that is, in order to increase a difference in wavelength response between the pixels 130, the lens is preferably designed such that the distance $z_f$ between the polarization-wavelength separation lenses 160 and the pixel array 110 is reduced while the focal distance $x_f$ along the x-axis is increased.

The polarization-wavelength separation lens 160 of Embodiment 1 hardly allows light absorption in the columnar structures 161 and does not cause undesired optical diffraction because the intervals of placement are shorter than the wavelength of light. Thus, according to the imaging element 200, incident light is subjected to polarization separation while hardly losing the power, and then the light condenses at a position corresponding to a wavelength on the pixel array 110, thereby achieving high light utilization efficiency. Hence, unlike the conventional imaging element in which light utilization efficiency is considerably limited by using a neutral-density polarization filter and a color filter, the imaging element 200 can remarkably increase the total amount of light reaching the pixel array 110, thereby increasing the imaging sensitivity.

In Embodiment 1, the bottom and the top surface of the columnar structure 161 is rectangular. The bottom and the top surface are not limited to these shapes. Specifically, even if the bottom and the top surface of the columnar structure 161 are shaped like a hollow rectangle, a cross, a circle, a hollow circle, or the like, the polarization dependence can be provided without losing an operation as an optical waveguide for producing the phase delay effect. The columnar structures 161 may be connected to one another. The same effect can be expected in a pattern including at least one hole structure.

The imaging element 200 having the polarization separation function and the off-axis lens function can be formed by thin film deposition and patterning according to a known semiconductor manufacturing technique. The polarization-wavelength separation lens 160 according to Embodiment 1 has a simple configuration of a microstructure pattern having a uniform thickness, so that lower manufacturing cost is expected. Moreover, the polarization-wavelength separation lens 160 including only one layer of the single microstructure pattern has the functions of polarization separation and wavelength separation. Thus, it is assumed that the imaging element 200 according to Embodiment 1 achieves a smaller number components and lower manufacturing cost as compared with the conventional imaging element.

[Light-Receiving Characteristics of Pixels]

The calculation results of the light-receiving characteristics of the pixels 130 in the imaging element 200 according to Embodiment 1 will be described below as a more specific example.

Figures 1, 16:
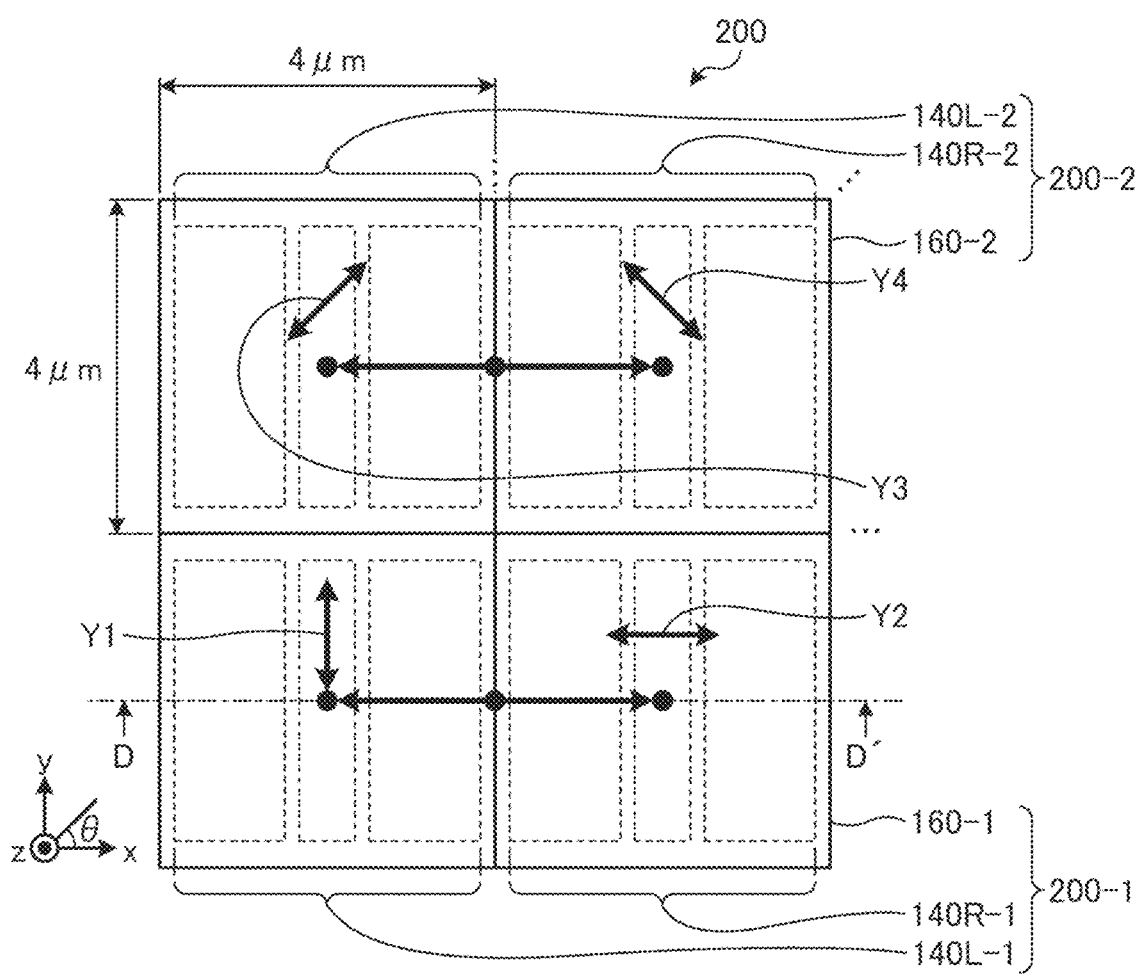
Figures 2, 16:
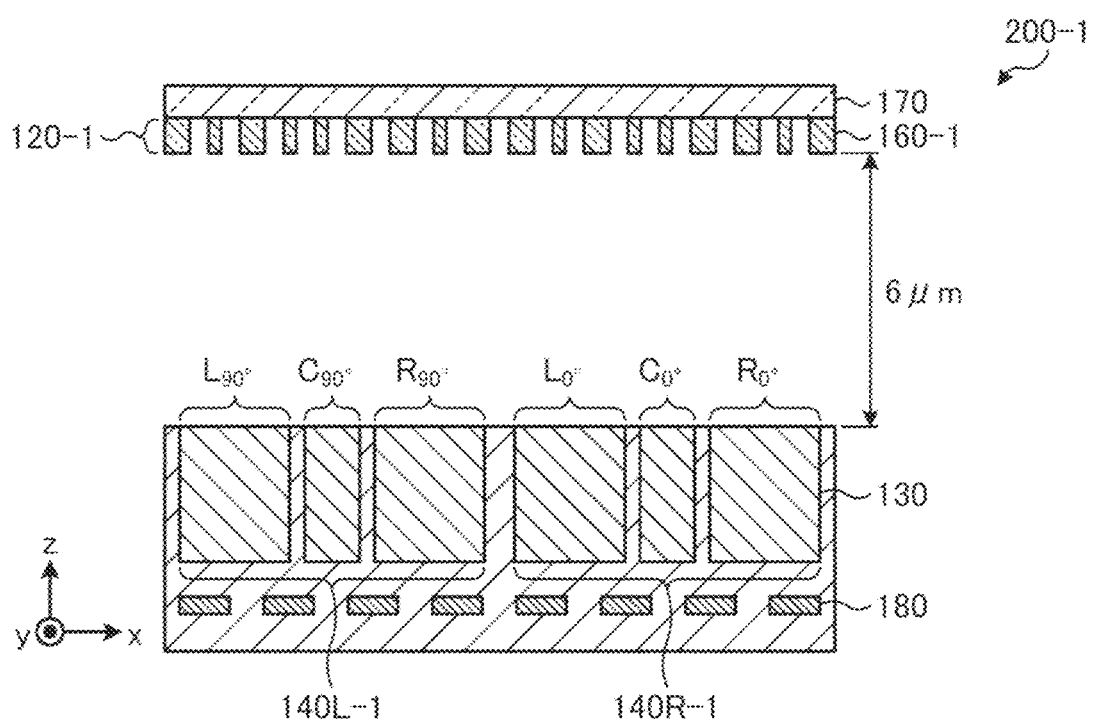

FIG. 16-1 is a plan view of the imaging element 200 serving as a calculation model. FIG. 16-2 is a cross-sectional view taken along line D-D' of FIG. 16-1. In the calculation of the light-receiving characteristics of the pixels 130, it is assumed that the two kinds of the first polarization unit 200-1 and the second polarization unit 200-2 in FIG. 16-1 are periodically and infinitely arranged based on the rigorous coupled wave theory.

It is assumed that the first polarization-wavelength separation lens 160-1 and the second polarization-wavelength separation lens 160-2 include the layout of the columnar structures 161 illustrated in FIG. 14. The distance $z_f$ between the lens and the pixel array is 6 µm. Moreover, it is assumed that the pixel units 140L-1, 140R-1, 140L-2, and 140R-2 are all 4-µm squares and each of the pixel units 140L-1, 140R-1, 140L-2, and 140R-2 includes three pixels.

For example, the left and right pixels (e.g., pixels $L_{90}°$, $R_{90}°$, $L_0°$, $R_0°$ in FIG. 16-2) of the three pixels in each of the pixel units 140L-1, 140R-1, 140L-2, and 140R-2 have a width $w_1$ of 1.67 µm in the x-axis direction and a width $w_2$ of 4 µm in the y-axis direction. The central pixel (e.g., pixels $C_{90}°$, $C_0°$ in FIG. 16-2) of the three pixels in each of the pixel units 140L-1, 140R-1, 140L-2, and 140R-2 has a width $w_1$ of 0.67 µm in the x-axis direction and a width $w_2$ of 4 µm in the y-axis direction. The central pixels $C_{90}°$ and $C_0°$ in the pixel units 140 have smaller light-receiving areas than other pixels. The dimensions of the pixels are not limited to the foregoing dimensions. The dimensions can be changed according to the lens design or a required spatial resolution.

Figure 17:
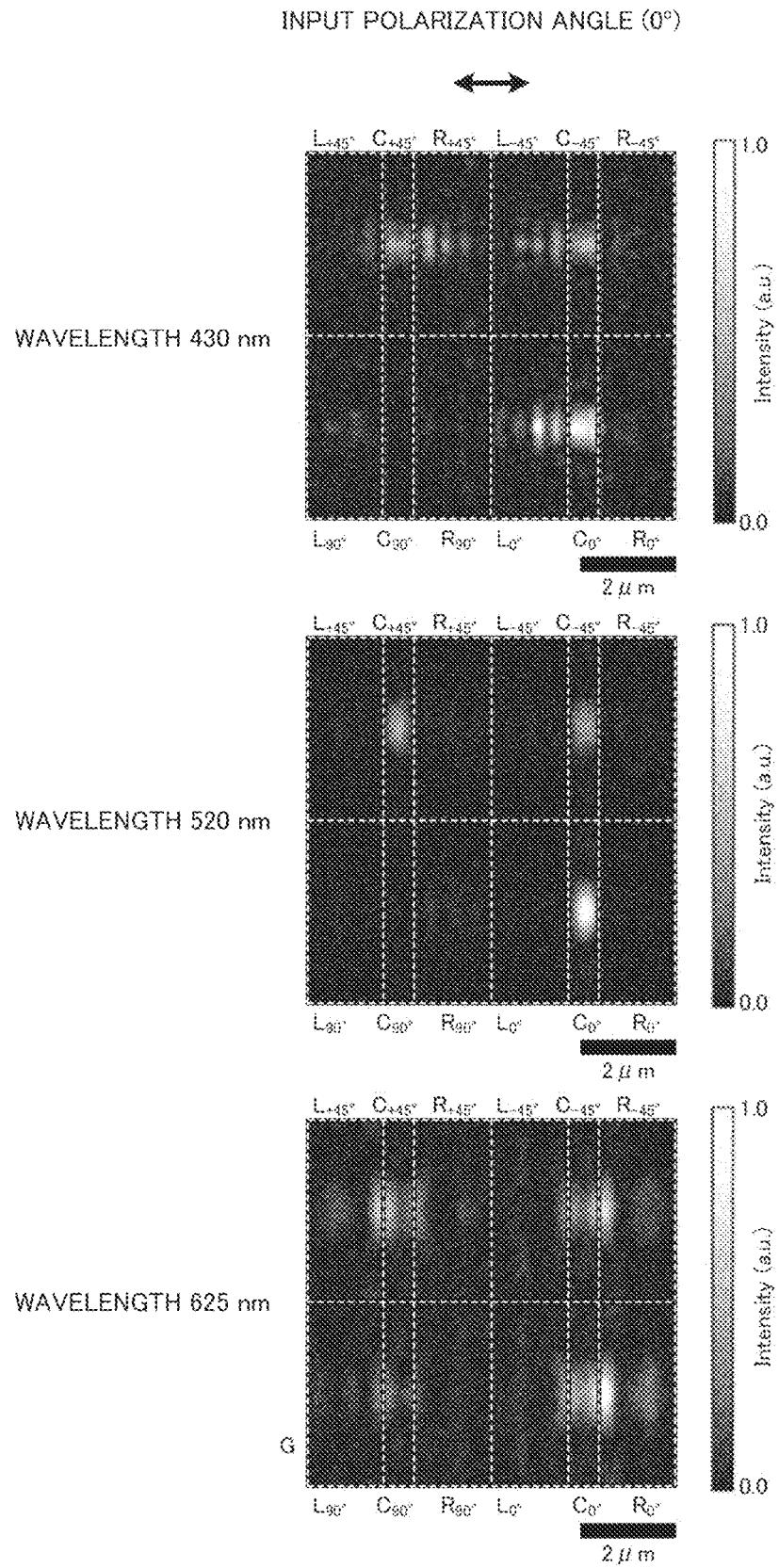
FIG. 17 indicates light intensity distributions on the pixel array when light with a combination of a predetermined polarization state and a predetermined wavelength vertically enters the imaging element illustrated in FIG. 16-1.

FIGS. 17 to 20 indicate light intensity distributions on the pixel array 110 when light with a combination of a predetermined polarization state and a predetermined wavelength vertically enters the imaging element 200 illustrated in FIG. 16-1. The layout of the pixel units in FIGS. 17 to 20 is identical to the layout of the pixel units 140L-1, 140R-1, 140L-2, and 140R-2 in FIG. 16-1. FIGS. 17 to 20 indicate the light intensity distributions in the pixel units when light with a wavelength of 430 nm, a wavelength of 520 nm, and a wavelength of 625 nm vertically enters the imaging element 200. FIG. 17 corresponds to incident light in a polarization state of 0°, FIG. 18 corresponds to incident light in a polarization state of 90°, FIG. 19 corresponds to incident light in a polarization state of 45°, and FIG. 20 corresponds to incident light in a polarization state of −45°.

As illustrated in FIGS. 17 to 20, in all of the results, light condenses in the pixel unit corresponding to the polarization state, and wavelength dependence is found at the condensing position of the light.

Specifically, when the input polarization angle is 0°, light condenses in the pixel unit 140R-1 that is a 0°-polarization pixel group at the bottom right (see FIG. 17). When the input polarization angle is 90°, light condenses in the pixel unit 140L-1 that is a 90°-polarization pixel group at the bottom left (see FIG. 18). When the input polarization angle is 45°, light condenses in the pixel unit 140L-2 that is a 45°-polarization pixel group at the upper left (see FIG. 19). When the input polarization angle is −45°, light condenses in the pixel unit 140R-2 that is a −45°-polarization pixel group at the upper right (see FIG. 20).

Figure 18:
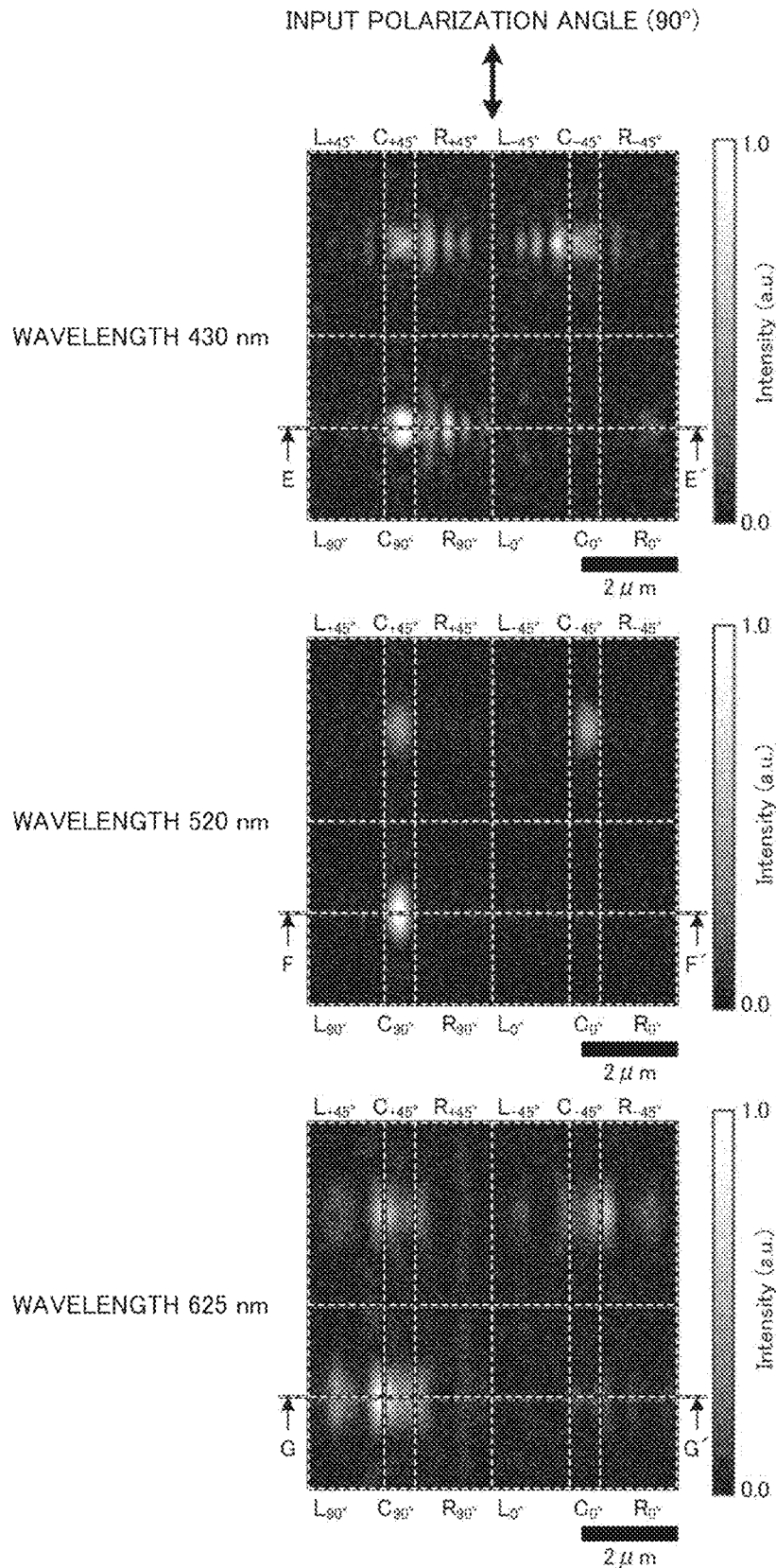
FIG. 18 indicates light intensity distributions on the pixel array when light with a combination of a predetermined polarization state and a predetermined wavelength vertically enters the imaging element illustrated in FIG. 16-1.
Figure 19:
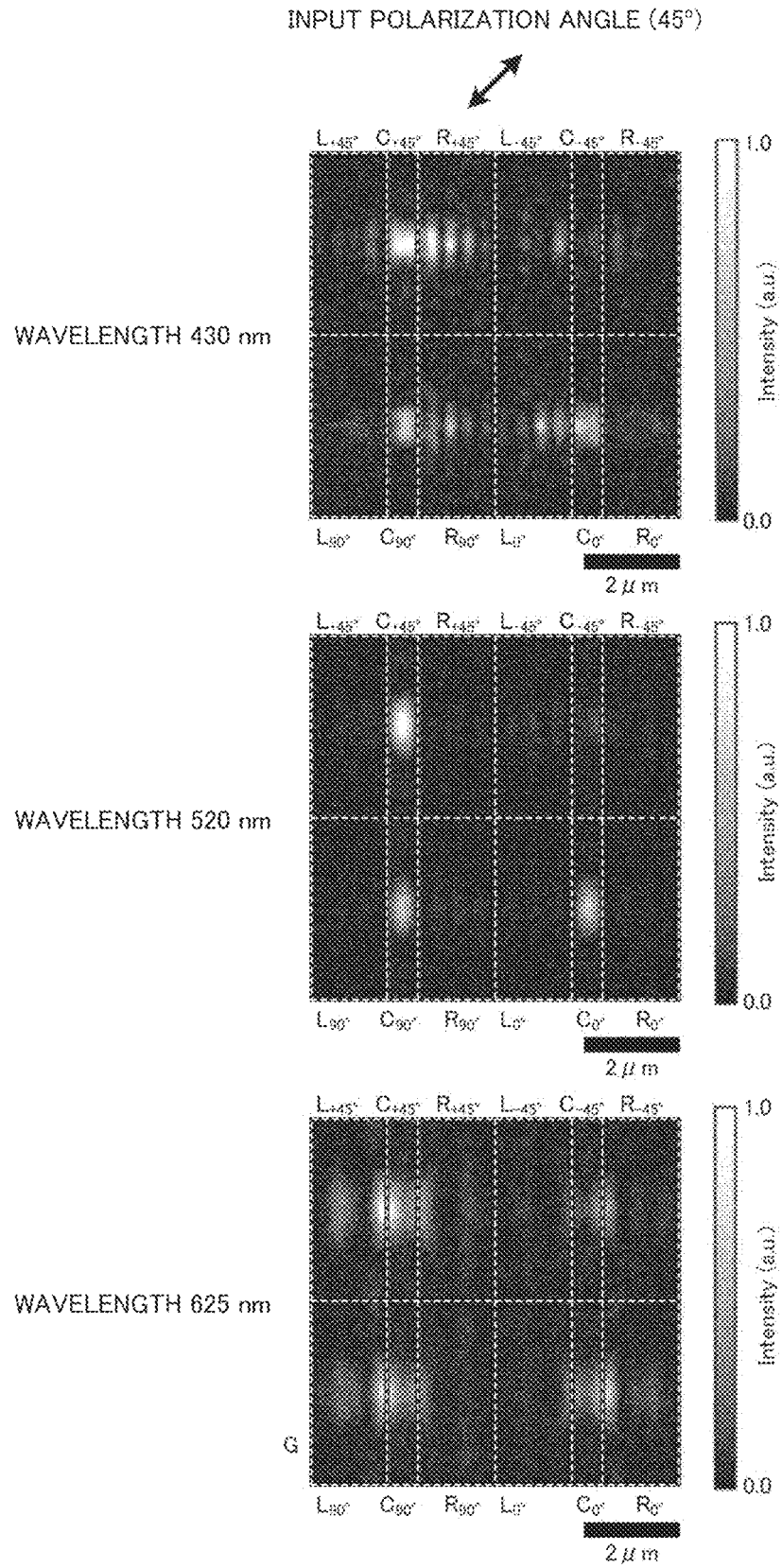
FIG. 19 indicates light intensity distributions on the pixel array when light with a combination of a predetermined polarization state and a predetermined wavelength vertically enters the imaging element illustrated in FIG. 16-1.
Figure 20:
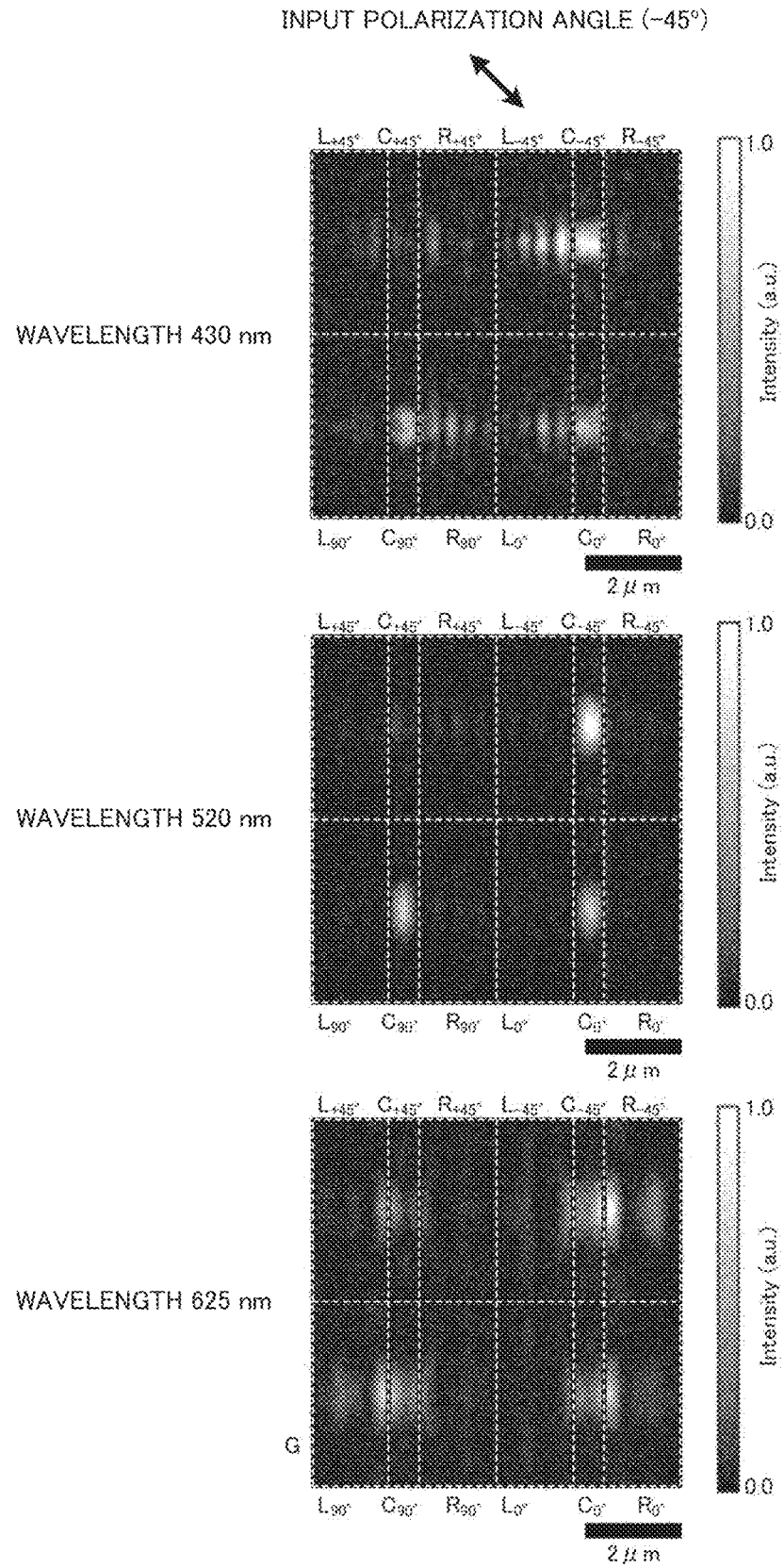
FIG. 20 indicates light intensity distributions on the pixel array when light with a combination of a predetermined polarization state and a predetermined wavelength vertically enters the imaging element illustrated in FIG. 16-1.
Figure 21:
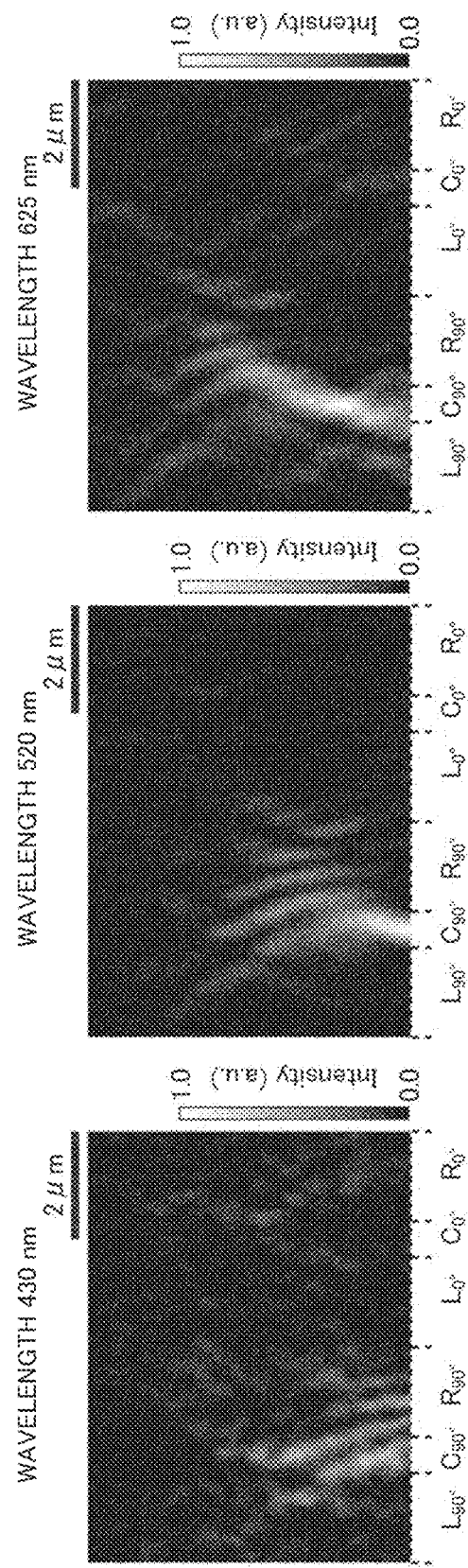
FIG. 21 illustrates a cross-sectional view taken along line E-E', a cross-sectional view taken along line F-F', and a cross-sectional view taken along line G-G' in FIG. 18.

FIG. 21 illustrates a cross-sectional view taken along line E-E', a cross-sectional view taken along line F-F', and a cross-sectional view taken along line G-G' in FIG. 18. FIG. 21 indicates light intensity distributions in the cross sections of the pixels $L_{90}°$, $C_{90}°$, $R_{90}°L_0°$, $C_0°$, and $R_0°$ in the pixel units 140L-1 and 140R-1. FIG. 21 also indicates light propagation in the first polarization-wavelength separation lens 160-1. In FIG. 21, the polarization state of incident light is linearly polarized light in the 90° direction. The wavelengths (625 nm, 520 nm, 430 nm) of the light correspond to RGB respectively.

As indicated in FIG. 21, a condensing position shifts according to the wavelength. Specifically, light with a wavelength of 430 nm corresponding to B condenses at the right pixel $R_{90}°$ of the pixel unit 140L-1, light with a wavelength of 520 nm corresponding to G condenses at the central pixel $C_{90}°$ of the pixel unit 140L-1, and light with a wavelength of 625 nm corresponding to R condenses at the left pixel $L_{90}°$ of the pixel unit 140L-1. The shift of the condensing position is equivalent to a behavior predicted from Formula (7).

Figure 22:
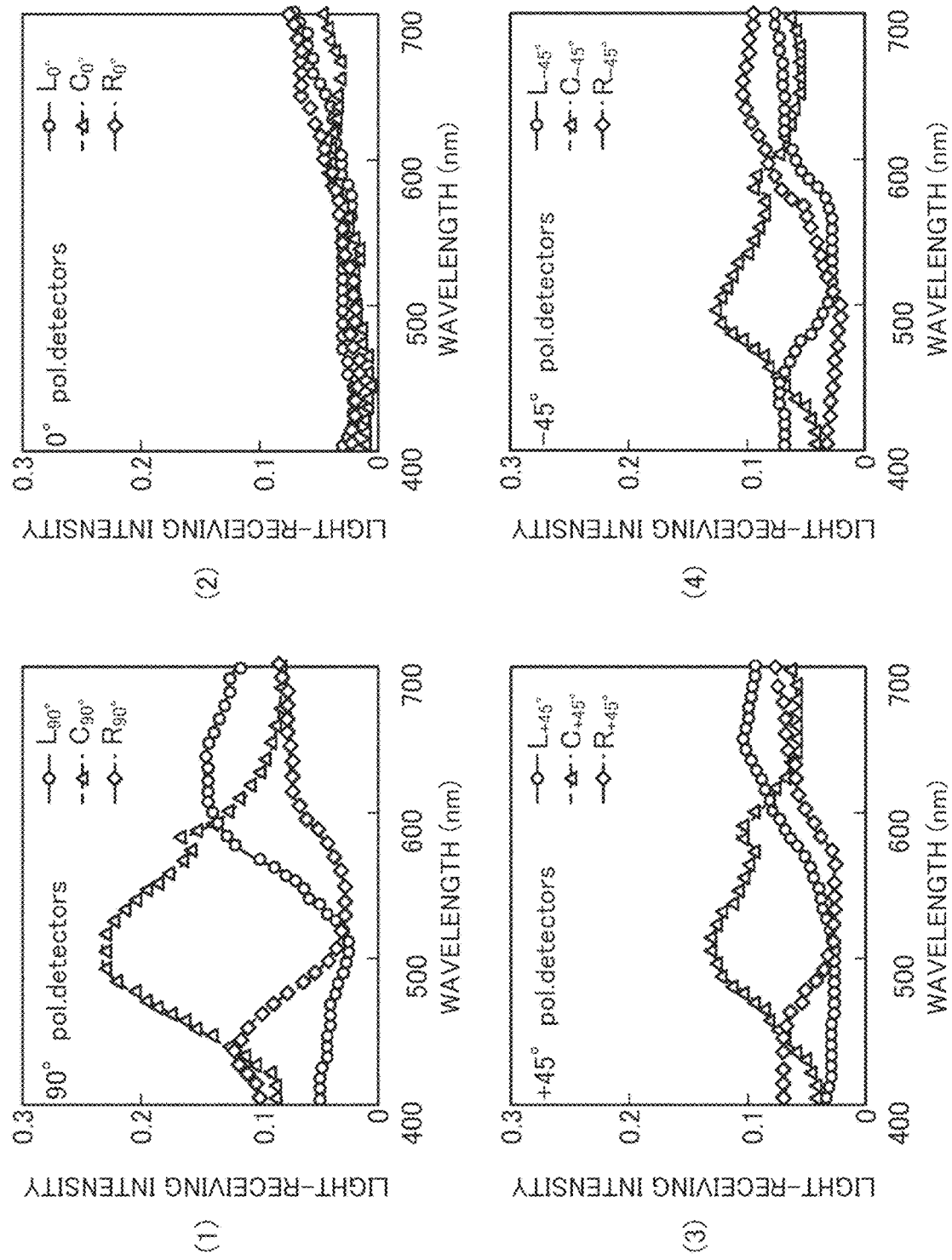
FIG. 22 indicates wavelength spectrums received by the pixels of pixel units according to Embodiment 1 when linearly polarized light enters in the 90° direction.

FIG. 22 indicates wavelength spectrums received by the pixels of pixel units according to Embodiment 1 when linearly polarized light enters in the 90° direction. (1) in FIG. 22 indicates wavelength spectrums received by the pixels of the pixel unit 140L-1 serving as a 90°-polarization pixel group. (2) in FIG. 22 indicates wavelength spectrums received by the pixels of the pixel unit 140R-1 serving as a 0°-polarization pixel group. (3) in FIG. 22 indicates wavelength spectrums received by the pixels of the pixel unit 140L-2 serving as a 45°-polarization pixel group. (4) in FIG. 22 indicates wavelength spectrums received by the pixels of the pixel unit 140R-2 serving as a −45°-polarization pixel group.

As indicated by (1) in FIG. 22, the highest intensity of received light is obtained in the pixel unit 140L-1 serving as the 90°-polarization pixel group corresponding to incident polarization, whereas as indicated by (2) in FIG. 22, the lowest intensity of received light is obtained in the pixel unit 140R-1 serving as the 0°-polarization pixel group. In this way, the polarization separation function by the polarization-wavelength separation lens 160 was confirmed in the imaging element 200. As indicated by (3) and (4) in FIG. 22, in the pixel unit 140L-2 serving as the 45°-polarization pixel group and the pixel unit 140R-2 serving as the −45°-polarization pixel group, the intensity of received light is about a half of the intensity of light received in the 90°-polarization pixel group due to vector resolution.

It is understood that wavelength spectrums received by the pixels in the pixel units 140L-1, 140R-1, 140L-2, and 140R-2 considerably vary among the pixels. As a specific example, as indicated by (1) in FIG. 22, the pixel unit 140L-1 serving as the 90°-polarization pixel group includes the left pixel $L_{90}°$ having a peak at a wavelength corresponding to R, the central pixel $C_{90}°$ having a peak at a wavelength corresponding to G, and the right pixel $R_{90}°$ having a peak at a wavelength corresponding to B. According to a difference in the wavelength spectrum of the light-receiving sensitivity, the imaging apparatus 10 can precisely extract color information by using signal processing, which will be described later.

Figure 23:
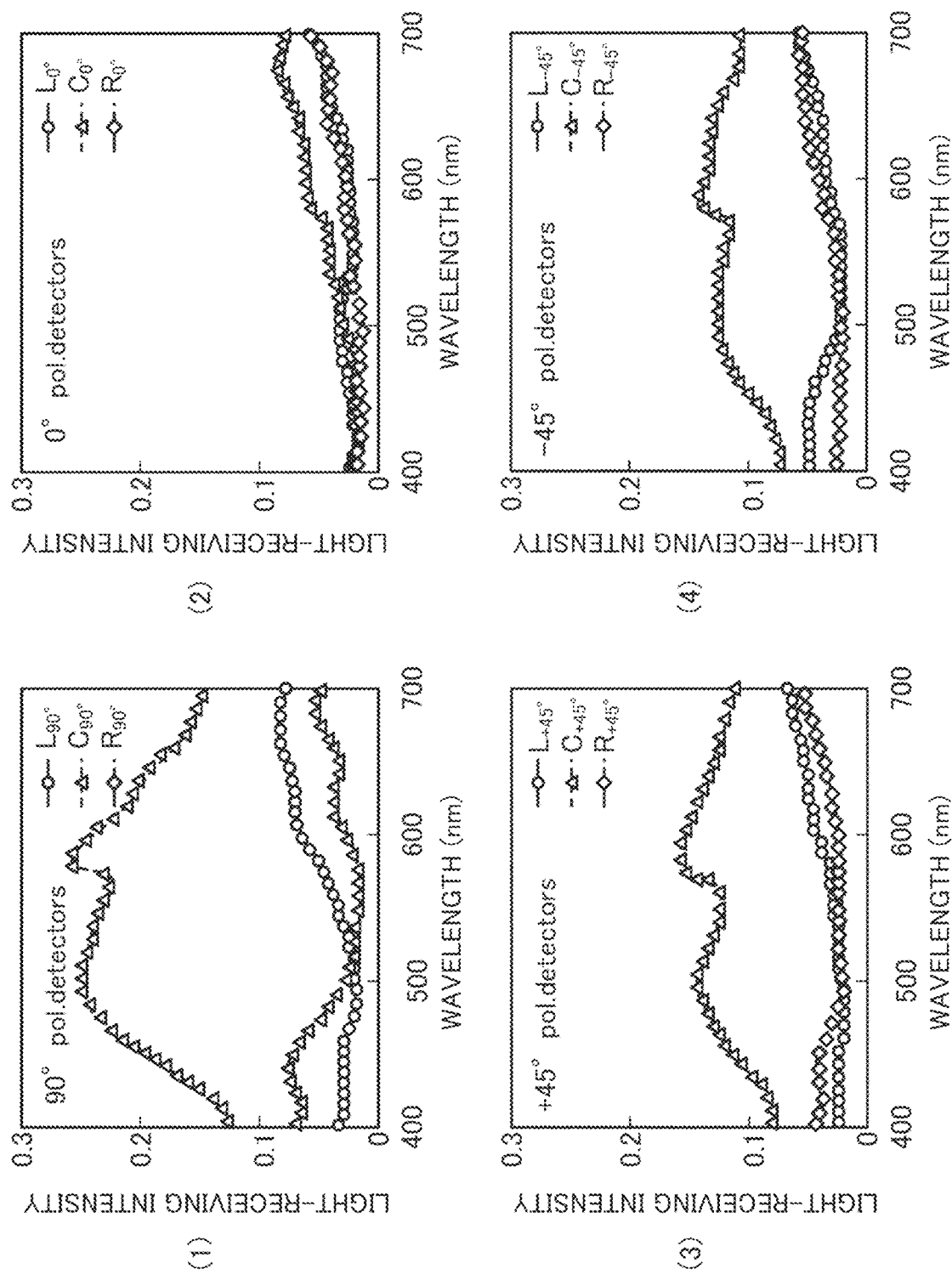
FIG. 23 indicates another example of wavelength spectrums received by the pixels of the pixel units according to Embodiment 1 when linearly polarized light enters in the 90° direction.

FIG. 23 indicates another example of wavelength spectrums received by the pixels of the pixel units according to Embodiment 1 when linearly polarized light enters in the 90° direction. FIG. 23 indicates wavelength spectrums received by the pixels when three pixels constituting each of the pixel units have the same light-receiving area. In this case, the pixels are all sized to have a width $w_1$ of 1.33 μm in the x-axis direction and a width $w_2$ of 4 μm in the y-axis direction. (1) in FIG. 23 indicates wavelength spectrums received by the pixels of the 90°-polarization pixel group. (2) in FIG. 23 indicates wavelength spectrums received by the pixels of the 0°-polarization pixel group. (3) in FIG. 23 indicates wavelength spectrums received by the pixels of the 45°-polarization pixel group. (4) in FIG. 23 indicates wavelength spectrums received by the pixels of the −45°-polarization pixel group.

As indicated in FIG. 23, even if three pixels constituting each of the pixel units have the same light-receiving area, the polarization separation function by the polarization-wavelength separation lens 160 can be confirmed. Moreover, it is understood that wavelength spectrums received by the pixels constituting the pixel units vary among the pixels. Thus, as in the case of FIG. 22, color information can be precisely extracted by using signal processing, which will be described later.

Comparing the light-receiving spectrum with the central pixel having a smaller width than the left and right pixels in the x-axis direction (see FIG. 22) and the light-receiving spectrum with the pixels of the same size (FIG. 23), the wavelength spectrums of the pixels in FIG. 22 are more sharply shaped. In FIG. 22, the central pixel has a smaller width than the left and right pixels in the x-axis direction. In other words, the light-receiving spectrums in FIG. 23 illustrating the pixels of the same size have broader shapes than the light-receiving spectrums in FIG. 22.

This is because the central pixel (a condensing position at a lens design wavelength) has a smaller width in the pixel unit where the central pixel has a smaller width than the left and right pixels in the x-axis direction, and thus the left and right pixels adjacent to the central pixel are likely to receive light at a condensing position shifted according to the wavelength. In the case of the signal processing, which will be described later, sharp wavelength spectrums are more likely to improve the accuracy of color reconstruction and resistance to signal noise. Thus, in Embodiment 1, the pixel corresponding to the condensing position at the design wavelength is preferably smaller in size than other pixels.

Based on the light-receiving spectrums indicated in FIG. 22 or 23, the mean value of the total amount of light reaching all the pixels of the imaging element 200 was calculated in a visible light region (a wavelength of 400 nm to 700 nm), so that the mean value was about 80% of the amount of incident light. In other words, the imaging element 200 according to Embodiment 1 achieves light utilization efficiency almost five times higher than the maximum value of the light utilization efficiency of the polarization color imaging element using the conventional filter.

[Signal Processing]

The signal processing for implementing color information extraction according to Embodiment 1 will be described below. As indicated in FIGS. 22 and 23, the wavelength components of light received by the pixels constituting the pixel units 140L-1, 140R-1, 140L-2, and 140R-2 vary among the pixels. In this case, it is known that color information can be precisely extracted by using a matrix operation and an inverse problem solution or the like (for details, see NPL 3).

As an example of a color information extraction method, color information extraction using a matrix operation will be described below. If an RGB signal-value vector including RGB values to be determined is denoted as Y, an acquired signal-value vector including the acquired signal values of three pixels is denoted as X, and a transformation matrix is denoted as A(3×3), the RGB signal-value vector Y can be expressed by Formula (8).

[Math. 8]

$$Y=AX \qquad (8)$$

The transformation matrix A may be determined, from the wavelength spectrums for defining RGB and wavelength spectrums actually received by three pixels, so as to reduce a transformation error by using the method of least squares or regularization or the like. The determined transformation matrix A can be used for transforming the acquired signal-value vector X into the RGB signal-value vector Y according to Formula (8).

As another example of the color information extraction method, color information extraction using an inverse problem solution will be described below. If the wavelength spectrum of incident light is denoted as and a vector including wavelength spectrums actually received by three pixels is denoted as F, the acquired signal-value vector X can be expressed by Formula (9).

[Math. 9]

$$X=F\varphi \qquad (9)$$

According to Formula (9), the wavelength spectrum Φ of incident light is solved as an inverse problem from the acquired signal-value vector X. Thus, the wavelength spectrum of incident light can be estimated, and the values of RGB can be determined from the wavelength spectrum. As a method of solving the inverse problem, for example, the steepest-descent method can be used.

The signal processing is merely exemplary. Various matrix operations, inverse problem solutions, and optimization methods can be used as the color information extraction.

Effect of Embodiment 1

As described above, the imaging element 200 according to Embodiment 1 can condense rays of light from a subject at different positions on the pixel array 110 according to the polarization direction and the wavelength components. By using a photoelectric conversion signal from each pixel, a color image and a polarization image can be generated by one shot.

Embodiment 2

Figure 24:
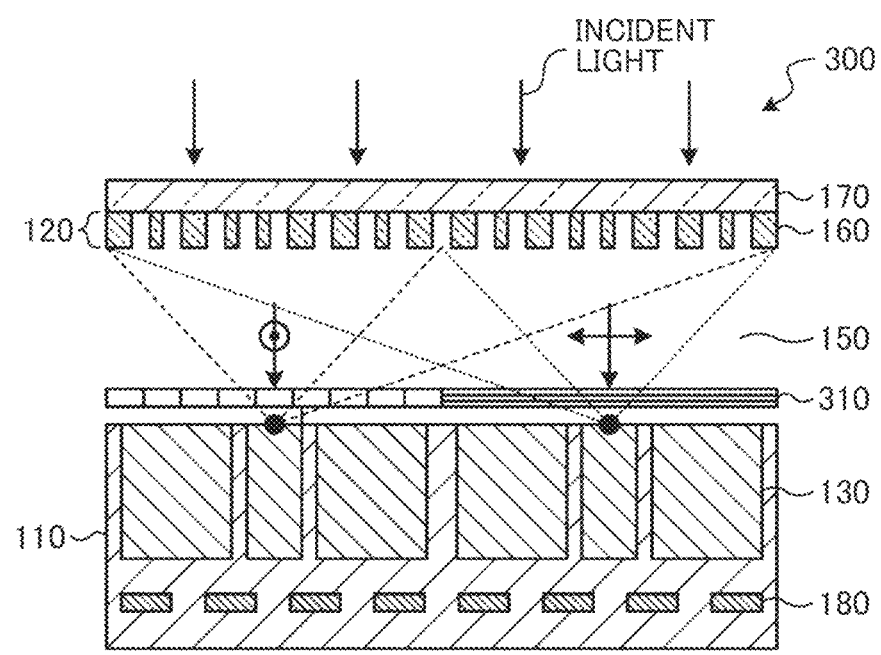
FIG. 24 schematically illustrates a part of a pixel array and a polarization-wavelength separation lens array of an imaging element in cross section according to Embodiment 2.

Embodiment 2 will be described below. FIG. 24 schematically illustrates a part of a pixel array and a polarization-wavelength separation lens array of an imaging element in cross section according to Embodiment 2.

As illustrated in FIG. 24, unlike the imaging element 200 according to Embodiment 1, an imaging element 300 according to Embodiment 2 includes a polarization filter 310, which is provided for each polarization direction, between a pixel array 110 and a polarization-wavelength separation lens array 120, that is, above the pixel units of the pixel array 110. The polarization filter 310 is composed of, for example, a metallic-wire grid or a photonic crystal and can be implemented by a known technique. Other constituent elements in the imaging element 300 are identical to those of the imaging element 200.

As indicated in FIG. 24, incident light is subjected to polarization separation through polarization-wavelength separation lenses 160 and then is filtered through the polarization filter 310 directly above pixel units. At this point, a polarization direction corresponding to the pixel units disposed immediately below the polarization filter 310 and the polarizing transmission axis of the polarization filter 310 are aligned with each other.

Effect of Embodiment 2

As described above, the imaging element 300 according to Embodiment 2 achieves the same functions as those described in Embodiment 1 and obtains two additional effects as follows:

First, the imaging element 300 can obtain the effect of considerably reducing crosstalk in the polarization filter 310. In the case of the imaging element 200 according to Embodiment 1, two light condensing points appear in the same polarization unit, the condensing points including polarization components condensed at different positions on the pixel array 110. At this point, the light condensing points have extensions and thus may cause an overlap of light (crosstalk) around the boundary of two adjacent pixel groups in the same polarization unit. The overlap of light may deteriorate a polarization extinction ratio or cause an extraction error of color information. In contrast, as illustrated in FIG. 24, the imaging element 300 used in combination with the polarization filter 310 can guide light into the pixel units while cutting components other than desired polarization components, thereby completely removing an overlap of light around the boundary of the pixel units.

Furthermore, the imaging element 300 can obtain the effect of improving the polarization extinction ratio. In the case of the imaging element 200 according to Embodiment 1, the extinction ratio of polarization components may be insufficiently obtained during polarization separation depending on the design of the polarization-wavelength separation lens 160 or the influence of a production error or the like. In contrast, the imaging element 300 used in combination with the polarization filter 310 performs double polarization filtering through the polarization-wavelength separation lens 160 and the polarization filter 310, thereby improving the extinction ratio.

The imaging element 300 used in combination with the polarization filter 310 can obtain the two effects while keeping high light utilization efficiency. This is because the imaging element 300 performs polarization filtering after polarization separation and thus hardly reduces the total amount of light reaching the pixel array 110.

As described above, the imaging element 300 according to Embodiment 2 achieves the same functions as those described in Embodiment 1. Additionally, the imaging element 300 obtains the effect of considerably reducing crosstalk in the polarization unit. Furthermore, the imaging element 300 obtains the effect of improving the polarization extinction ratio during polarization separation. Embodiment 2 is similar to Embodiment 1 except for the use of the polarization filter 310, has the same effects as those described in Embodiment 1, and can be changed as Embodiment 1.

Figure 25:
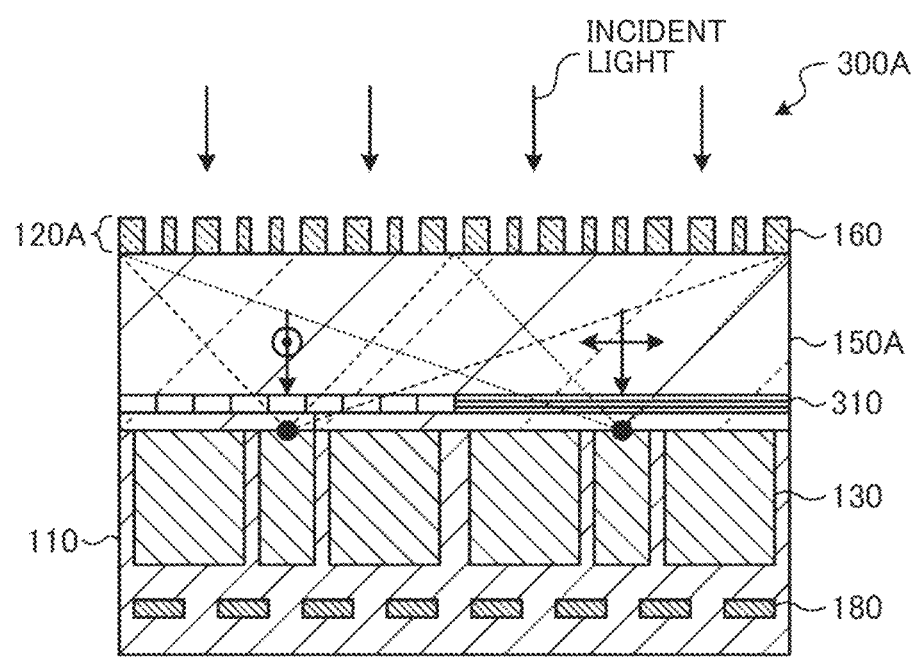
FIG. 25 schematically illustrates another example of a part of the pixel array and the polarization-wavelength separation lens array of the imaging element in cross section according to Embodiment 2.
Figure 26:
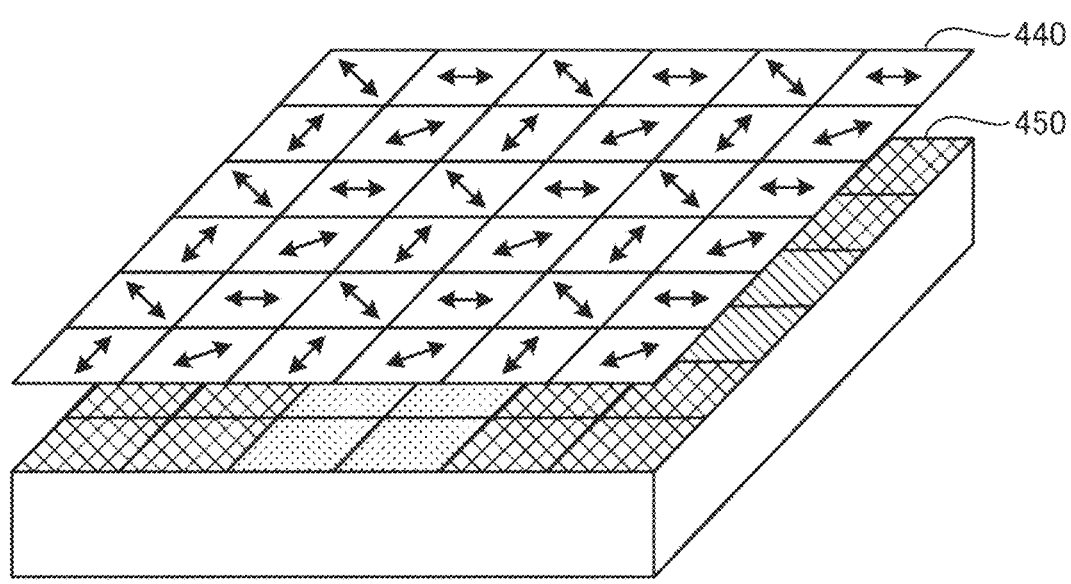
FIG. 26 is an explanatory drawing schematically illustrating the configuration of a conventional polarization-color imaging element.
Figure 27:
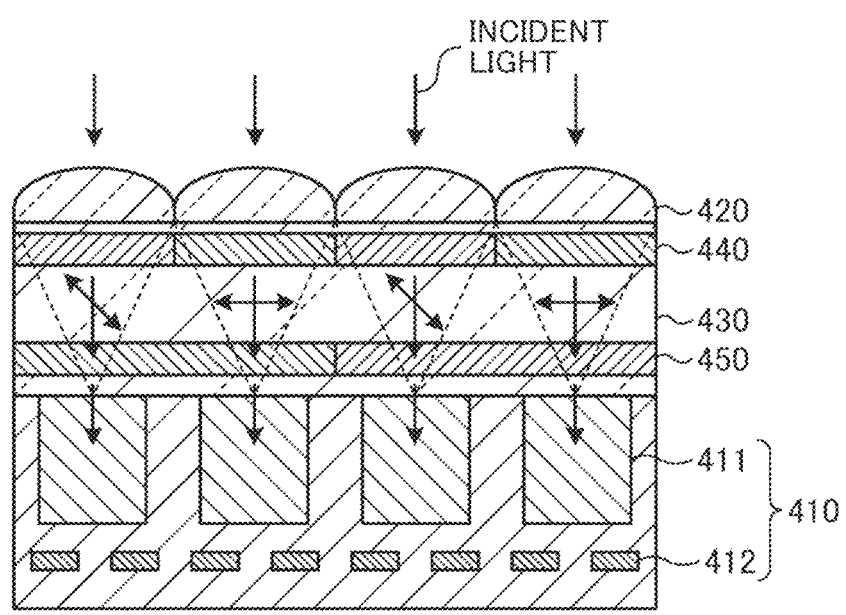
FIG. 27 illustrates a part of a cross-sectional view of the conventional polarization-color imaging element.
Figure 28:
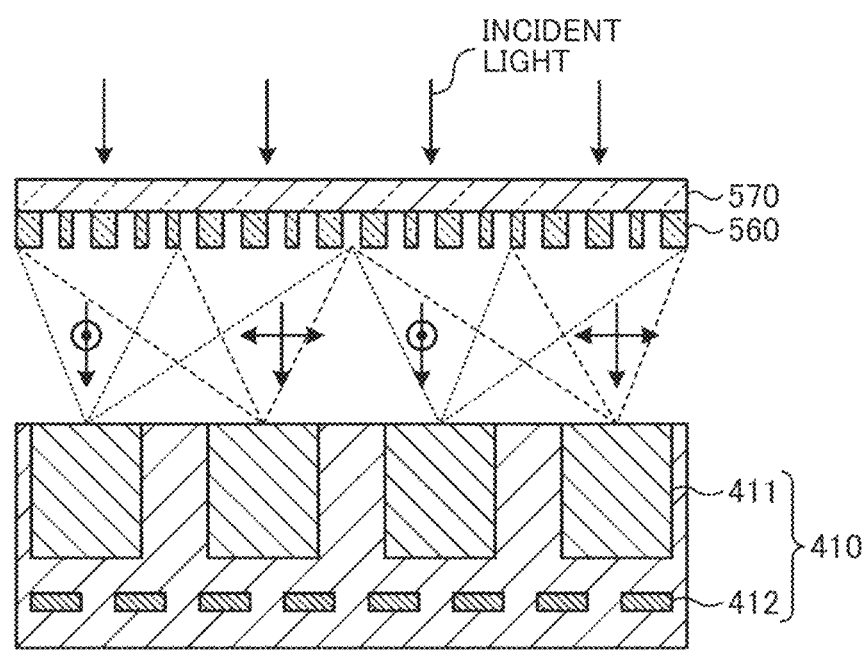
FIG. 28 illustrates a part of a cross-sectional view of a conventional polarization imaging element.
Figure 29:
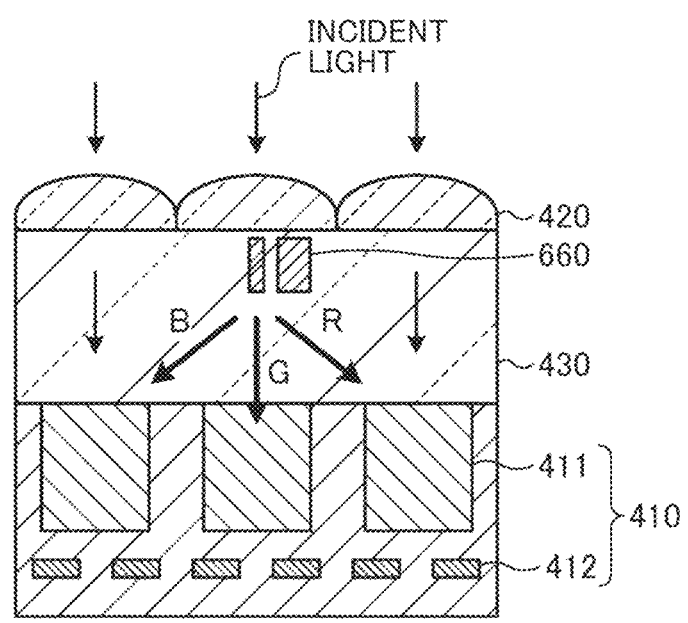
FIG. 29 illustrates a part of a cross-sectional view of a conventional color imaging element.

FIG. 25 schematically illustrates another example of a part of the pixel array and the polarization-wavelength separation lens array of the imaging element in cross section according to Embodiment 2. Like an imaging element 300A of FIG. 25, the imaging element according to Embodiment 2 may be configured such that a polarization-wavelength separation lens array 120A is formed on the top surface of a transparent layer 150A formed on the pixel array 110 and is opposed to the pixel array 110. In this case, the polarization filter 310 may be disposed in the transparent layer 150.

Embodiments 1 and 2 are merely specific preferred examples of the present invention. The present invention is not limited to the embodiments and can be changed in various ways.

Embodiments 1 and 2 described examples in which the polarization-wavelength separation lens 160 is made of SiN. The material of the polarization-wavelength separation lens 160 is not limited thereto. For example, if the imaging elements 100, 100A, 200, 300, and 300A are used for the regions of visible light to near infrared light with a wavelength of light ranging from 380 nm to 1000 nm, materials such as SiN, SiC, TiO$_2$, and GaN are suitable for the polarization-wavelength separation lens 160 because of the high refractive index and the low absorption loss. If the imaging elements 100, 100A, 200, 300, and 300A are used for the near-infrared light region with a wavelength ranging from 800 nm to 1000 nm, materials such as Si, SiC, SiN, TiO$_2$, GaAs, and GaN are suitable for the polarization-wavelength separation lens 160 that is a low-loss lens for the light. Furthermore, in a near-infrared region of a long wavelength range (e.g., 1.3 µm or 1.55 µm as a communication wavelength), InP or the like is usable as a material of the polarization-wavelength separation lens 160 in addition to the foregoing materials.

If the minute spectral elements of the polarization-wavelength separation lens 160 are formed by bonding and coating, the polarization-wavelength separation lens 160 may be made of materials including polyimide such as fluorinated polyimide, BCB (benzocyclobutene), light curing resin, UV epoxy resin, acrylic resin such as PMMA, and polymers such as resists in general.

Likewise, in the examples of Embodiments 1 and 2, the materials of the transparent layers 150 and 150A include but not limited to SiO$_2$ and an air layer. The transparent layers 150 and 150A may be composed of a typical glass material, SiO$_2$, an air layer, and the like as long as the refractive index is lower than that of the polarization-wavelength separation lens 160 with a low loss with respect to the wavelength of incident light. Alternatively, each of the transparent layers 150 and 150A may be a transparent layer having a multilayer structure made of multiple materials.

In Embodiments 1 and 2, polarization components separated by the polarization-wavelength separation lens 160 are linearly polarized light in the directions of 0°, 45°, 90°, and −45° with respect to any one axis. The polarization components are not limited thereto. Depending on the design of the microstructure pattern of the polarization-wavelength separation lens 160, circularly polarized light or elliptical polarization components can be separated. The separation of linear polarization components and the separation of circular polarization components may be mixed. For example, an imaging element may include three polarization units (two units are provided for linear polarization components, whereas one unit is provided for separating circular polarization components), each having the function of separating linearly polarized light in the directions of 0°, 45°, 90°, and −45 and the function of separating clockwise and counter-clockwise circular polarization components. In the case of the imaging element having this configuration, Stokes parameters for describing a polarization state can be all derived, thereby completely acquiring the polarization state of a subject.

In the examples of Embodiments 1 and 2, the light of three wave ranges corresponding to the polarization-wavelength separation lens 160 is light of three primary colors R, G, and B. At least one of the three wave ranges may be light (e.g., infrared light or ultraviolet light) with a wavelength other than three primary colors.

The present invention was described based on the specific embodiments. It is obvious that the present invention is not limited to the foregoing embodiments and can be changed in various ways within the scope of the invention.

REFERENCE SIGNS LIST

1 Object
10 Imaging apparatus
11 Lens optical system
12, 100, 100A, 200, 300, 300A Imaging element
13 Signal processing unit
110 Pixel array
120, 120A, 120-1, 120-2 Polarization-wavelength separation lens array
130 Pixel
140, 140L, 140R, 140L-1, 140R-1, 140L-2, 140R-2 Pixel unit
150, 150A Transparent layer
160 Polarization-wavelength separation lens
160-1 First polarization-wavelength separation lens
160-2 Second polarization-wavelength separation lens
161 Columnar structure
170 Transparent substrate
180 Wire layer
200-1 First polarization unit
200-2 Second polarization unit
310 Polarization filter

The invention claimed is:
1. An imaging element comprising:
a pixel array in which pixels are placed in a two-dimensional array; and
a spectral element array, opposed to the pixel array, the spectral element array including spectral elements placed in a two-dimensional array, the spectral element array including a plurality of microstructures for condensing incident light at different positions on the pixel array according to a polarization direction and wavelength components of the incident light,
wherein the spectral elements have a polarization separation function of changing a propagation direction of incident light according to a first polarization direction and a second polarization direction so as to spatially split the incident light for each polarization component and guide the light which has been split to different positions on the pixel array,
the imaging element further comprising a transparent layer formed on the pixel array,
wherein:
the plurality of microstructures are formed in or on the transparent layer, the microstructures being made of a material having a higher refractive index than a refractive index of the transparent layer,
the plurality of microstructures have an equal length in a vertical direction with respect to a pixel array surface of the pixel array, vary in size on a plane parallel to the pixel array surface of the pixel array, and are placed at shorter intervals than a wavelength of the incident light, and
the microstructures on the parallel plane are sized such that light passing through the microstructures is provided with different phase delay amounts in respective polarization directions.

2. An imaging element, comprising:
a pixel array in which pixels are placed in a two-dimensional array;
a spectral element array, opposed to the pixel array, the spectral element array including spectral elements placed in a two-dimensional array, the spectral element array including a plurality of microstructures for condensing incident light at different positions on the pixel array according to a polarization direction and wavelength components of the incident light; and
a transparent layer formed on the pixel array,
wherein:
the plurality of microstructures are formed in or on the transparent layer, the microstructures being made of a material having a higher refractive index than a refractive index of the transparent layer,
the plurality of microstructures have an equal length in a vertical direction with respect to a pixel array surface of the pixel array, vary in size on a plane parallel to the pixel array surface of the pixel array, and are placed at shorter intervals than a wavelength of the incident light, and
the microstructures on the parallel plane are sized such that light passing through the microstructures is provided with different phase delay amounts in respective polarization directions.

3. An imaging element, comprising:
a pixel array in which pixels are placed in a two-dimensional array; and
a spectral element array, opposed to the pixel array, the spectral element array including spectral elements placed in a two-dimensional array, the spectral element array including a plurality of microstructures for condensing incident light at different positions on the pixel array according to a polarization direction and wavelength components of the incident light,
wherein:
the pixel array includes a first pixel unit and a second pixel unit that correspond to one of the spectral elements, the first pixel unit including three of the pixels, the three pixels being consecutively placed in one direction of the pixel array, the second pixel unit including three of the pixels, the three pixels being consecutively placed in one direction of the pixel array,
the spectral element splits the incident light in a first polarization direction and a second polarization direction that is a different polarization direction from the first polarization direction,
the first pixel unit is disposed at a condensing position of polarization components in the first polarization direction, out of light incident on the spectral element,
the second pixel unit is disposed at a condensing position of polarization components in the second polarization direction, out of light incident on the spectral element, and
a layout position and a light-receiving area of each of the pixels for the pixel units are set according to wavelength dependence of the corresponding condensing position.

4. The imaging element according to claim 3, wherein:
in the first pixel unit and the second pixel unit, a central axis has a smaller light-receiving area than other pixels.

5. The imaging element according to claim 3, further comprising:
a polarization filter provided between the pixel array and the spectral element array such that a polarization direction and a polarizing transmission axis are aligned with each other, the polarization direction corresponding to the first pixel unit or the second pixel unit that is disposed immediately below the polarization filter.

6. An imaging apparatus comprising:
the imaging element according to claim 1;
an imaging optical system for forming an optical image on an imaging surface of the imaging element; and
a signal processor for processing an electric signal outputted from the imaging element and generating a polarization image and a color image.

7. An imaging apparatus comprising:
the imaging element according to claim 2;
an imaging optical system for forming an optical image on an imaging surface of the imaging element; and
a signal processor for processing an electric signal outputted from the imaging element and generating a polarization image and a color image.

8. An imaging apparatus comprising:
the imaging element according to claim 3;
an imaging optical system for forming an optical image on an imaging surface of the imaging element; and
a signal processor for processing an electric signal outputted from the imaging element and generating a polarization image and a color image.

* * * * *